(12) United States Patent
Cho et al.

(10) Patent No.: US 12,543,338 B2
(45) Date of Patent: Feb. 3, 2026

(54) SEMICONDUCTOR DEVICE

(71) Applicant: Samsung Electronics Co., Ltd., Suwon-si (KR)

(72) Inventors: Namkyu Cho, Suwon-si (KR); Jungtaek Kim, Suwon-si (KR); Moonseung Yang, Suwon-si (KR); Sumin Yu, Suwon-si (KR); Seojin Jeong, Suwon-si (KR); Seokhoon Kim, Suwon-si (KR); Pankwi Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 445 days.

(21) Appl. No.: 18/117,405

(22) Filed: Mar. 4, 2023

(65) Prior Publication Data

US 2023/0378336 A1  Nov. 23, 2023

(30) Foreign Application Priority Data

May 20, 2022  (KR) .................. 10-2022-0061997

(51) Int. Cl.
*H01L 29/775* (2006.01)
*H01L 29/06* (2006.01)
(Continued)

(52) U.S. Cl.
CPC ......... *H10D 30/43* (2025.01); *H10D 30/6735* (2025.01); *H10D 62/115* (2025.01); *H10D 62/121* (2025.01); *H10D 64/258* (2025.01)

(58) Field of Classification Search
CPC .. H10D 30/43; H10D 30/6735; H10D 62/115; H10D 62/121; H10D 64/258; H10D 30/6757; H10D 30/797; H10D 30/014; H10D 62/832; H10D 62/151; H10D 62/822; H10D 64/017; H10D 64/256; (Continued)

(56) References Cited

U.S. PATENT DOCUMENTS 9,614,060 B2  4/2017  Kim et al.
10,573,564 B2  2/2020  Mosden et al.
(Continued)

FOREIGN PATENT DOCUMENTS

KR  102099896 B1  4/2020

*Primary Examiner* — Tong-Ho Kim
(74) *Attorney, Agent, or Firm* — Muir Patent Law, PLLC

(57) ABSTRACT

A semiconductor device includes an active region extending on a substrate in a first direction, a plurality of channel layers on the active region to be spaced apart from each other in a vertical direction, perpendicular to an upper surface of the substrate, the plurality of channel layers including silicon germanium, a gate structure intersecting the active region and the plurality of channel layers on the substrate to surround the plurality of channel layers, respectively, a source/drain region on the active region on at least one side of the gate structure, the source/drain region in contact with the plurality of channel layers, and a substrate insulating layer disposed between the source/drain region and the substrate. The source/drain region includes a first layer in contact with a side surface of the gate structure, side surfaces of the plurality of channel layers, and an upper surface of the substrate insulating layer.

17 Claims, 23 Drawing Sheets

(51) Int. Cl.
  *H01L 29/417*   (2006.01)
  *H01L 29/423*   (2006.01)
  *H10D 30/43*    (2025.01)
  *H10D 30/67*    (2025.01)
  *H10D 62/10*    (2025.01)
  *H10D 64/23*    (2025.01)

(58) Field of Classification Search
  CPC .... H10D 62/116; H10D 84/834; H10D 30/62;
       H10D 62/83; H10D 84/853; B82Y 10/00
  USPC ........................................................ 257/401
  See application file for complete search history.

(56)           References Cited

U.S. PATENT DOCUMENTS

| 10,777,650  | B2  | 9/2020  | Sun et al.  |
| 10,833,085  | B2  | 11/2020 | Shin et al. |
| 10,903,077  | B2  | 1/2021  | Yoshida et al. |
| 10,930,734  | B2  | 2/2021  | Bao et al.  |
| 11,145,654  | B2  | 10/2021 | Lim et al.  |
| 11,222,952  | B2  | 1/2022  | Yang et al. |
| 2014/0091279 | A1  | 4/2014  | Kachian et al. |
| 2015/0380313 | A1  | 12/2015 | Ching et al. |
| 2019/0237360 | A1* | 8/2019  | Reznicek ........... H10D 30/0323 |
| 2020/0135853 | A1* | 4/2020  | Bao ................... H01L 21/02603 |
| 2020/0266296 | A1* | 8/2020  | Chu-Kung ........... H10D 84/038 |
| 2021/0082914 | A1* | 3/2021  | Lee ................... H10D 84/0147 |
| 2021/0242331 | A1* | 8/2021  | You ................... H10D 30/6735 |
| 2021/0336024 | A1  | 10/2021 | Chen et al. |
| 2021/0408283 | A1  | 12/2021 | Agrawal et al. |
| 2022/0037319 | A1  | 2/2022  | Kim et al.  |

\* cited by examiner

SEMICONDUCTOR DEVICE

CROSS-REFERENCE TO RELATED APPLICATION(S)

This application claims benefit of priority to Korean Patent Application No. 10-2022-0061997 filed on May 20, 2022 in the Korean Intellectual Property Office, the disclosure of which is incorporated herein by reference in its entirety.

BACKGROUND

One or more example embodiments relate to a semiconductor device.

As demand for implementation of high performance, high speed, and/or multifunctionalization of semiconductor devices increases, a degree of integration of semiconductor devices has been increasing. In manufacturing semiconductor devices having a fine pattern corresponding to the trend for a high degree of integration of semiconductor devices, it is necessary to implement patterns having a fine width or a fine separation distance. In addition, in order to overcome the limitation of operating properties due to the size reduction of a planar metal oxide semiconductor FET (MOSFET), efforts have been made to develop semiconductor devices including a FinFET having a three-dimensional channel structure.

SUMMARY

Example embodiments provide a semiconductor device having improved electrical properties.

According to an example embodiment, there is provided a semiconductor device including an active region extending on a substrate in a first direction, a plurality of channel layers on the active region to be spaced apart from each other in a vertical direction, perpendicular to an upper surface of the substrate, the plurality of channel layers including silicon germanium (SiGe), a gate structure intersecting the active region and the plurality of channel layers on the substrate to surround the plurality of channel layers, respectively, the gate structure extending in a second direction, a source/drain region on the active region on at least one side of the gate structure, the source/drain region in contact with the plurality of channel layers, and a substrate insulating layer disposed between the source/drain region and the substrate. The source/drain region may include a first layer in contact with a side surface of the gate structure, side surfaces of the plurality of channel layers, and an upper surface of the substrate insulating layer.

According to an example embodiment, there is provided a semiconductor device including an active region extending on a substrate in a first direction, a plurality of channel layers on the active region to be spaced apart from each other in a vertical direction, perpendicular to an upper surface of the substrate, the plurality of channel layers including silicon germanium (SiGe), a gate structure intersecting the active region and the plurality of channel layers on the substrate to surround the plurality of channel layers, respectively, the gate structure extending in a second direction, a source/drain region on the active region on at least one side of the gate structure, the source/drain region in contact with the plurality of channel layers, and a substrate insulating layer disposed between the source/drain region and the substrate. The source/drain region may include an epitaxial layer in contact with the substrate insulating layer, and passivation layers in contact with at least portions of the gate structure and the plurality of channel layers. The passivation layers may be spaced apart from each other in the first direction by the epitaxial layer.

According to an example embodiment, there is provided a semiconductor device including an active region extending on a substrate in a first direction, a plurality of channel layers on the active region to be spaced apart from each other in a vertical direction, perpendicular to an upper surface of the substrate, the plurality of channel layers including silicon germanium (SiGe), a gate structure intersecting the active region and the plurality of channel layers on the substrate to surround the plurality of channel layers, respectively, the gate structure extending in a second direction, a source/drain region on the active region on at least one side of the gate structure, the source/drain region in contact with the plurality of channel layers, and a substrate insulating layer disposed between the source/drain region and the substrate. The source/drain region may include an epitaxial layer in contact with side surfaces of the plurality of channel layers and an upper surface of the substrate insulating layer. At least a portion of a side surface of the epitaxial layer may form a surface, perpendicular to the upper surface of the substrate. A lower surface of the epitaxial layer may form a flat surface. A lower surface of a gate dielectric layer surrounding the lowermost gate electrode of the gate structure may be in contact with the upper surface of the substrate insulating layer.

A semiconductor device having improved electrical properties may be provided by using silicon germanium (SiGe) for a channel layer, controlling a structure of a source/drain region, and using a silicon on insulator (SOI) structure.

The various and beneficial advantages and effects of example embodiments are not limited to the above description, and will be more easily understood in the course of describing specific example embodiments.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, preferred example embodiments will be described with reference to the accompanying drawings.

Figure 1:
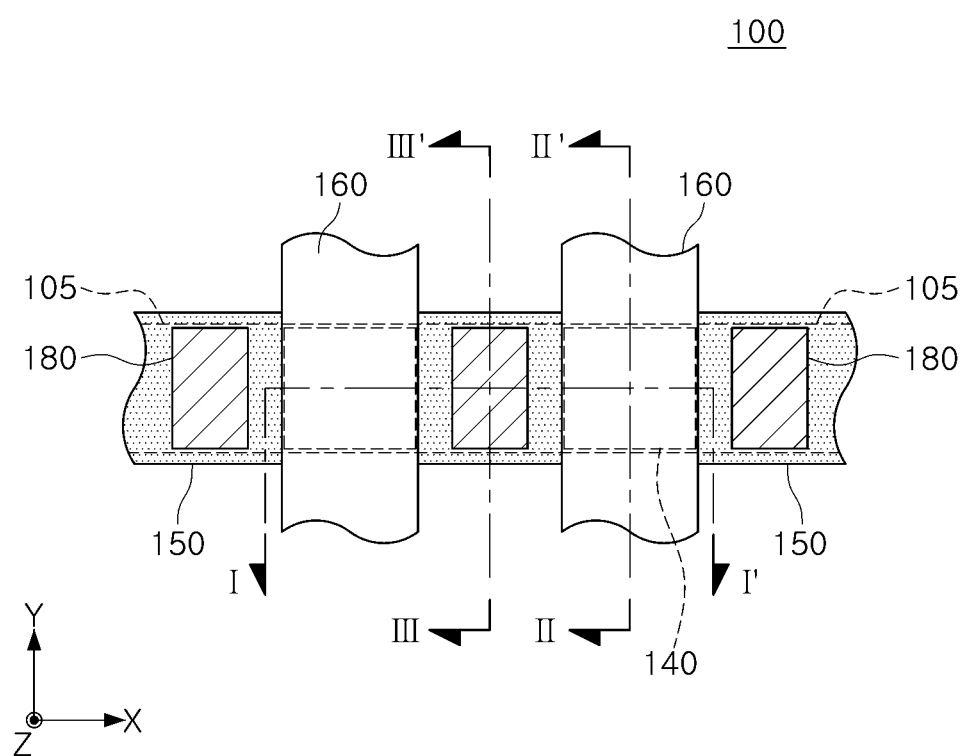
FIG. 1 is a plan view illustrating a semiconductor device according to example embodiments.

FIG. 1 is a plan view illustrating a semiconductor device according to example embodiments.

Figure 2A:
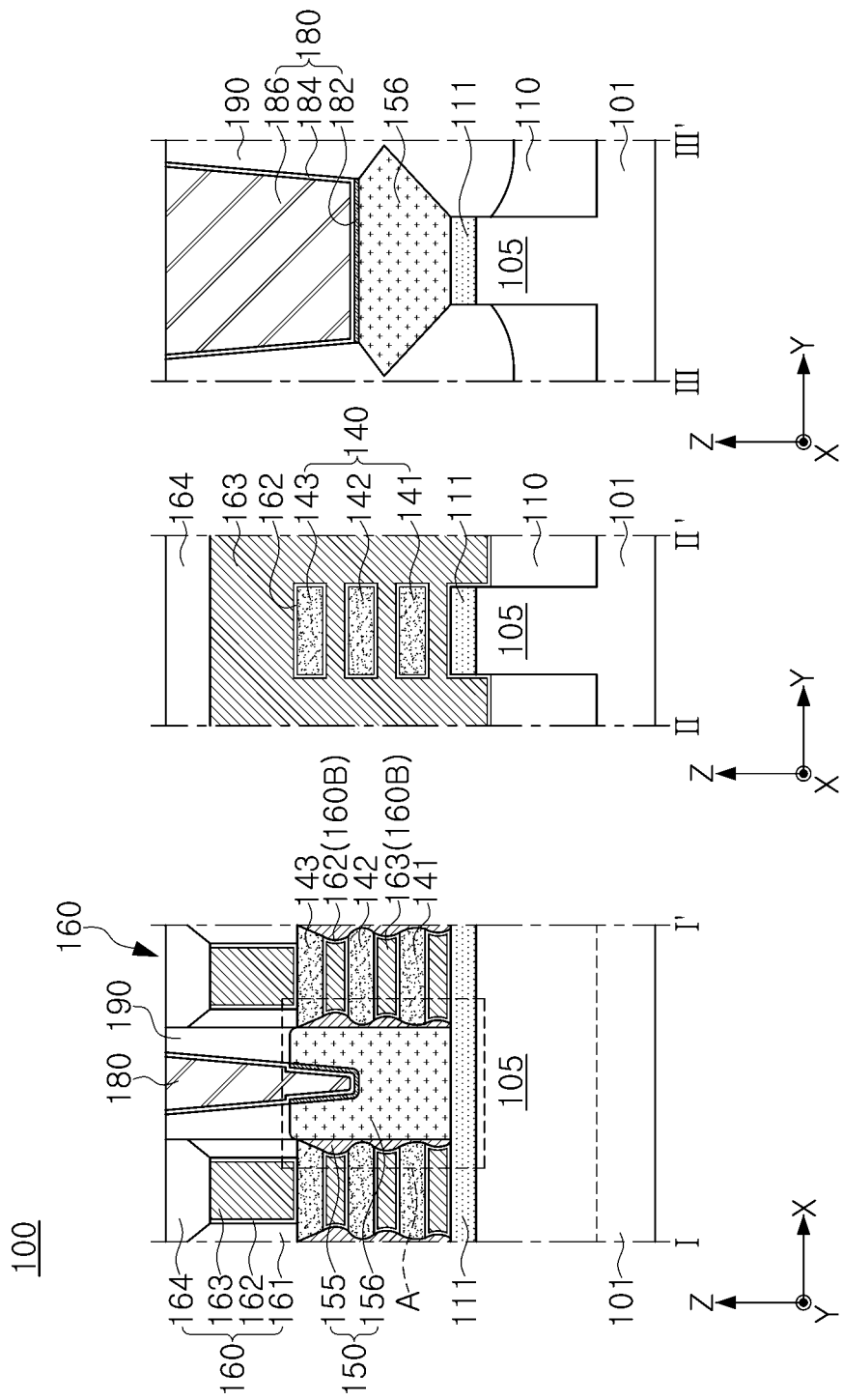
FIG. 2A is a cross-sectional view illustrating a semiconductor device according to example embodiments.

FIG. 2A is a cross-sectional view illustrating a semiconductor device according to example embodiments.

Figure 2B:
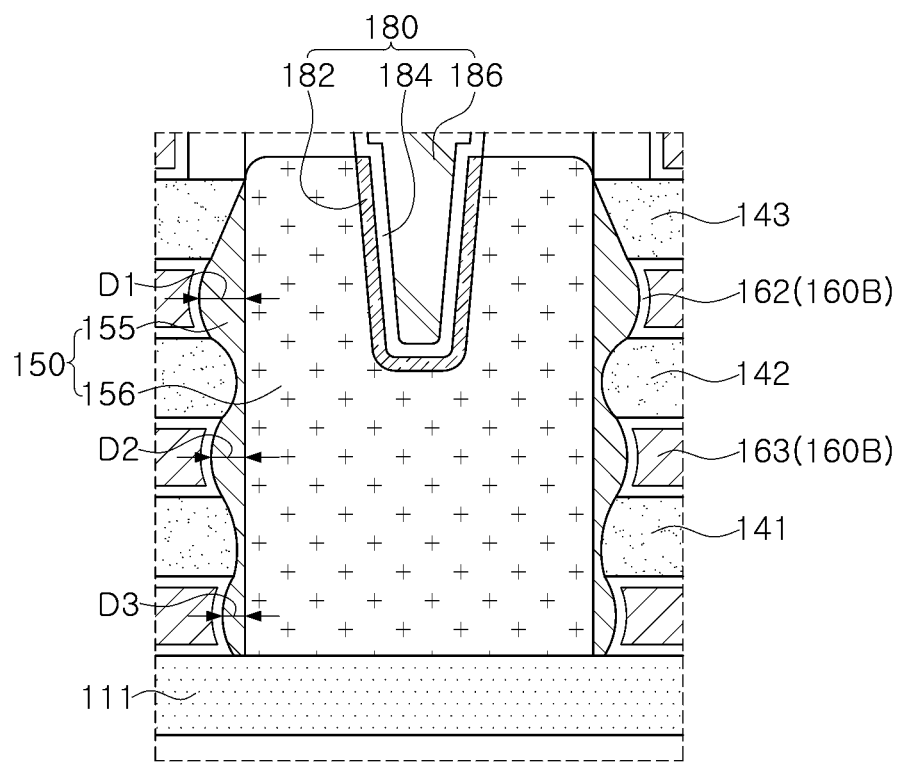
FIG. 2B is a partially enlarged view illustrating a portion of a semiconductor device according to example embodiments.

FIG. 2B is a partially enlarged view illustrating a portion of a semiconductor device according to example embodiments. FIG. 2B is an enlarged view of region A of FIG. 2A.

Figure 2C:
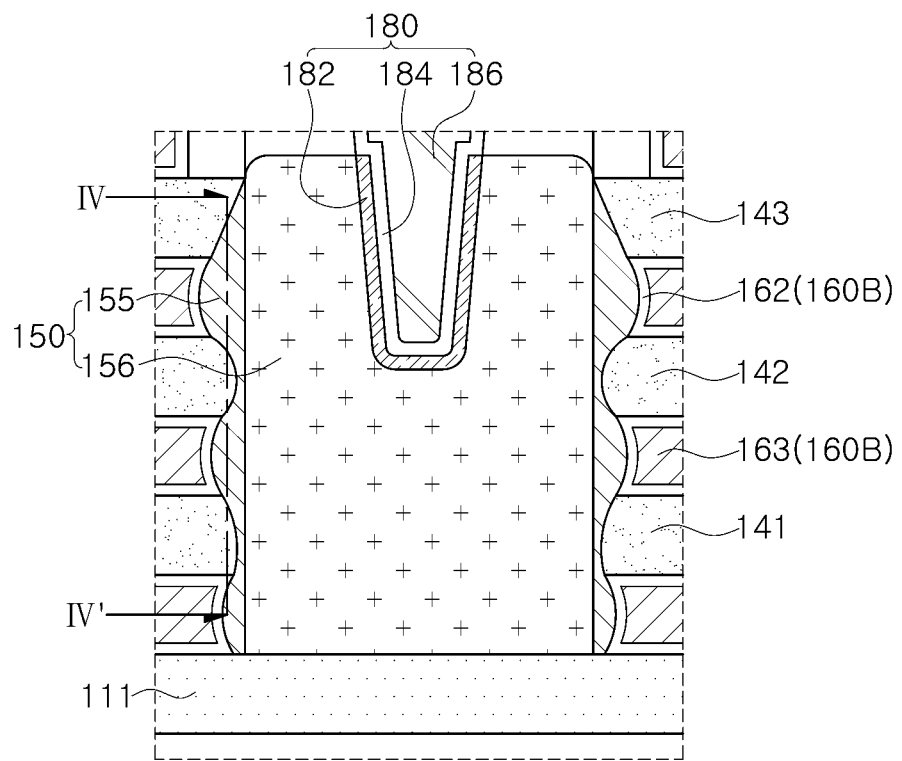
FIG. 2C illustrates a distribution of a germanium (Ge) concentration in a blocking layer and a channel layer of a semiconductor device according to example embodiments.
Figure 2C:
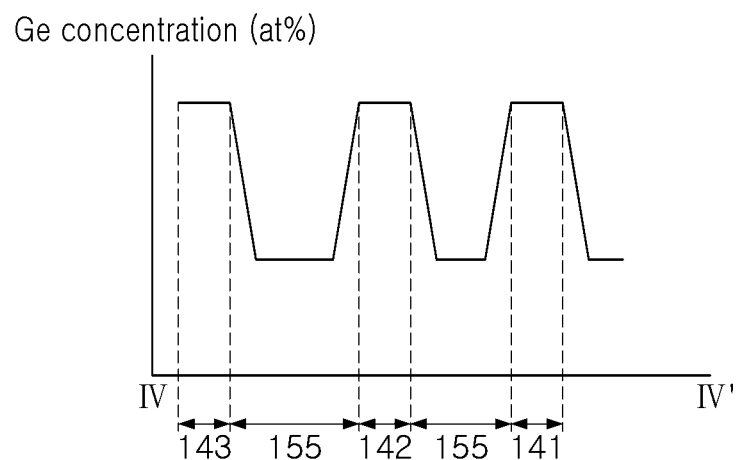

FIG. 2C illustrates a distribution of a germanium (Ge) concentration in a blocking layer and a channel layer of a semiconductor device according to example embodiments.

For ease of description, only major components of a semiconductor device are illustrated in FIGS. 1 and 2A to 2C.

Referring to FIGS. 1 and 2A to 2C, a semiconductor device 100 may include a substrate 101, an active region 105 on the substrate 101, a substrate insulating layer 111 on the active region 105, a channel structure 140 including a plurality of channel layers 141, 142, and 143 disposed to be vertically spaced apart from each other on the substrate insulating layer 111, a source/drain region 150 being in contact with the plurality of channel layers 141, 142, and 143, a gate structure 160 extending to intersect the active region 105, and a contact plug 180 connected to the source/drain region 150. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. The semiconductor device 100 may further include device isolation layers 110 and an interlayer insulating layer 190. The gate structure 160 may include a spacer layer 161, a gate dielectric layer 162, a gate electrode layer 163, and a gate capping layer 164.

In the semiconductor device 100, the active region 105 may have a fin structure, and the gate electrode layer 163 may be disposed between the active region 105 and the channel structure 140, between the plurality of channel layers 141, 142, and 143 of the channel structure 140, and on the channel structure 140. Accordingly, the semiconductor device 100 may include a gate-all-around field effect transistor formed by the channel structure 140, the source/drain region 150, and the gate structure 160, that is, a multi bridge channel FET (MBCFET™). The transistor may be, for example, NMOS transistors.

Figure 9A:
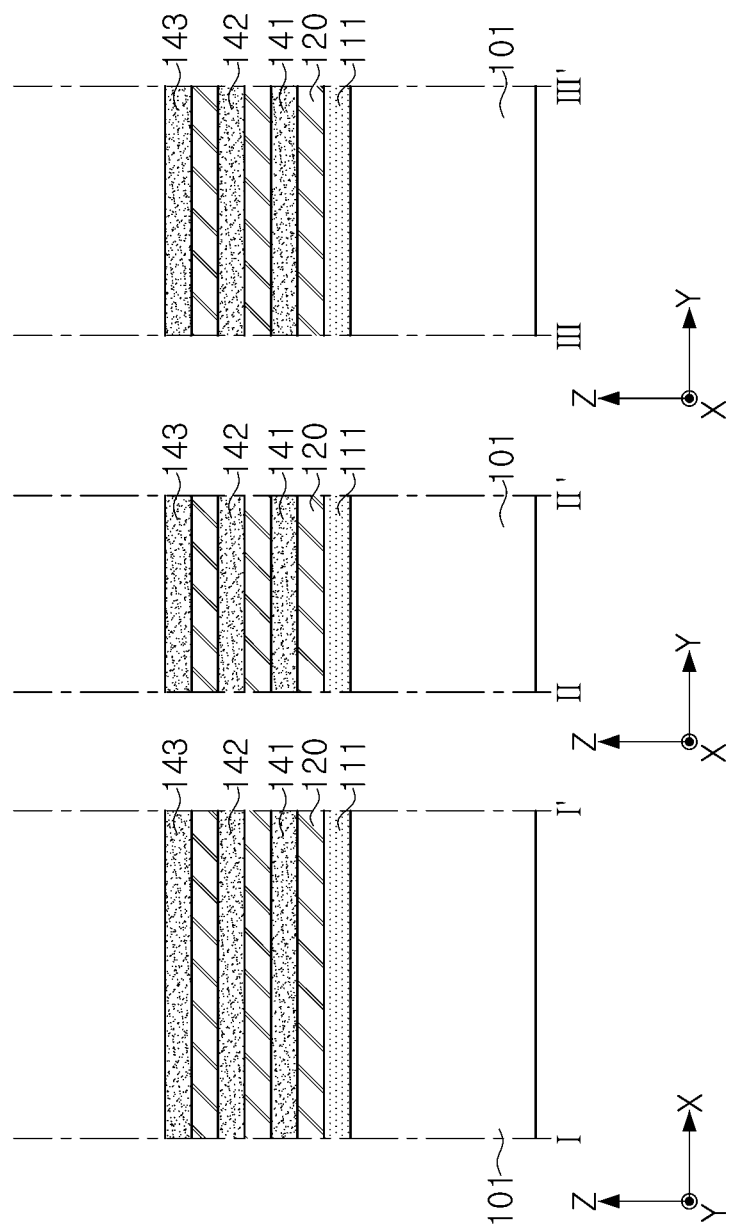
FIGS. 9A to 9J are cross-sectional views according to a process order so as to describe a method of manufacturing a semiconductor device according to example embodiments.

The substrate 101 may have an upper surface extending in an X-direction and a Y-direction. The substrate 101 may have an SOI structure including the substrate insulating layer 111 and the lowermost layer among sacrificial layers 120 (FIG. 9A). The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon on insulator (SOI) layer, a semiconductor on insulator (SeOI) layer, or the like. For example, the substrate 101 may be provided as an SOI substrate together with the substrate insulating layer 111.

The device isolation layer 110 may define the active region 105 in the substrate 101. The device isolation layer 110 may be formed by, for example, a shallow trench isolation (STI) process. In some example embodiments, the device isolation layer 110 may further include a region having a step below the substrate 101 and extending more deeply. The device isolation layer 110 may expose the substrate insulating layer 111, and partially expose a portion of an upper portion of the active region 105. In some example embodiments, the device isolation layer 110 may have a curved upper surface having a higher level as a distance to the active region 105 decreases. The device isolation layer 110 may be formed of an insulating material. The device isolation layer 110 may be, for example, an oxide, a nitride, or a combination thereof.

The active region 105 may be defined by the device isolation layer 110 in the substrate 101, and may be disposed to extend in a first direction X. The active region 105 may have a structure protruding from the substrate 101. An upper end of the active region 105 may be disposed to protrude to a predetermined height from an upper surface of the substrate 101. The active region 105 may be formed as a portion of the substrate 101, or may include an epitaxial layer grown from the substrate 101. However, on opposite sides of the gate structure 160, the active region 105 on the substrate 101 may be partially recessed, and the source/drain region 150 may be disposed on the recessed active region 105. The active region 105 may include impurities or may include doped regions including impurities.

The substrate insulating layer 111 may be flatly disposed on the active region 105. The substrate insulating layer 111 may be formed of, for example, a silicon oxide layer ($SiO_2$), a silicon nitride layer ($Si_3N_4$), or a combination thereof. Although the substrate insulating layer 111 is illustrated as being formed of a single layer, the substrate insulating layer 111 may be formed of a plurality of layers, as necessary. According to an example embodiment, a thickness of the substrate insulating layer 111 may satisfy a range of about 500 nm to about 2000 nm.

The channel structure 140 may include first to third channel layers 141, 142, and 143 that are two or more channel layers on the active region 105 to be spaced apart from each other in a direction, perpendicular to an upper surface of the active region 105, for example, a Z-direction. The first to third channel layers 141, 142, and 143 may be spaced apart from the upper surface of the active region 105 while being connected to the source/drain region 150. The first to third channel layers 141, 142, and 143 may have a width the same as or similar to that of the active region 105 in the Y-direction, and may have a width the same as or similar to that of the gate structure 160 in the X-direction. However, in some example embodiments, the first to third channel layers 141, 142, and 143 may have a reduced width such that side surfaces thereof are positioned below the gate structure 160 in the X-direction.

The first to third channel layers 141, 142, and 143 may be formed of a semiconductor material, and may include, for example, silicon germanium (SiGe). The number and shape of the channel layers 141, 142, and 143 included in one channel structure 140 may be changed in various manners in example embodiments. For example, in some example embodiments, the channel structure 140 may further include a channel layer disposed on the upper surface of the active region 105.

The source/drain region 150 may be disposed on recessed regions in which the active region 105 is recessed, on at least one side of the gate structure 160. The recess region may extend in the X-direction between the gate structures 160, and may have inner walls positioned at opposite ends in the X-direction and a bottom surface between the inner walls. The source/drain region 150 may be provided as a source region or a drain region of each of the transistors. An upper surface of the source/drain region 150 may be positioned on a height level similar to or higher than a lower surface of the gate structures 160, as illustrated in FIG. 2A. However, relative heights of the source/drain region 150 and the gate structures 160 may be changed in various manners depending on example embodiments. For example, the source/drain regions 150 may have an elevated source/drain shape in which an upper surface thereof is positioned to be higher than a lower surface of each of the gate structures 160, in particular, gate electrodes 163.

A cross-section, taken in the Y-direction, of the source/drain region 150 may have a pentagonal shape, a hexagonal shape, or a shape similar thereto, as illustrated in FIG. 2A. However, in example embodiments, the source/drain region 150 may have various shapes, for example, one of a polygonal shape, a circular shape, an oval shape, and a rectangular shape. In addition, a cross-section, taken in the X-direction, of the source/drain region 150 may have a substantially flat upper surface, as illustrated in FIG. 2A. The source/drain region 150 may be in contact with the upper surface of the substrate insulating layer 111, and thus may have a substantially flat lower surface. Terms such as "same," "equal," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements indicate otherwise.

The source/drain region 150 may include an epitaxial layer 156 and passivation layers 155.

The passivation layers 155 may be in contact with the substrate insulating layer 111, and the respective passivation layers 155 may be spaced apart from each other in the X-direction by the epitaxial layer 156. The passivation layers 155 may be in contact with a lower portion 160B of the gate structure 160 disposed below each of the channel layers 141, 142, and 143. According to an example embodiment, a contact surface of the passivation layers 155 and the epitaxial layer 156 may form a surface, perpendicular to an upper surface of the substrate 101.

Each of the passivation layers 155 may include protrusions protruding in the X direction toward the gate structure 160, on a level the same as that of the lower portion 160B of the gate structure 160. In some example embodiments, each side surface of the lower portion 160B of the gate structure 160 in the first direction X may be recessed to a predetermined depth, and thus may have an inwardly concave shape. Protrusions of the passivation layers 155 may be disposed in recessed regions of the lower portion 160B of the gate structure 160. A width in the first direction X of each of the passivation layers 155 on a level of the gate structure 160 may be greater than a width in the first direction X of each of the passivation layers 155 on a level of each of the first to third channel layers 141, 142, and 143.

According to an example embodiment, horizontal widths D1, D2, and D3 of the protrusions may become narrower as a distance to the substrate insulating layer 111 decreases. For example, among recessed regions of the lower portion 160B of the gate structure 160, the horizontal width D3 of the lowermost portion may be narrower than the horizontal width D2 between the lowermost portion and the uppermost portion, and the horizontal width D2 between the lowermost portion and the uppermost portion may be narrower than the horizontal width D1 of the uppermost portion. The horizontal widths D1, D2, and D3 of the protrusions are not limited to the above-described relationship, and may vary depending on example embodiments.

Each surface of the passivation layers 155 being in contact with the plurality of channel layers 141, 142, and 143 and the lower portion 160B of the gate structure 160 may have a wavy shape along the protrusions, but example embodiments are not limited thereto. The shapes of the passivation layers 155 may be changed depending on the shape of the channel structure 140, the shape of the gate structure 160, or the like. For example, when a semiconductor device further includes an outer spacer on the outside of the gate electrode layer 163 of the lower portion 160B, outer surfaces of the passivation layers 155 may have a gently curved shape. The passivation layers 155 may include silicon germanium (SiGe) doped with a group III element. In some example embodiments, the passivation layers 155 may include one of boron (B), aluminum (Al), gallium (Ga), indium (In), and thallium (Tl). In some example embodiments, the passivation layers 155 may include silicon germanium (SiGe) doped with a group V element, and may have a N-type conductivity. For example, the passivation layers 155 may include one of phosphorus (P) and arsenic (As), as a doping element.

The epitaxial layer 156 may be disposed to completely fill the recess region. The epitaxial layer 156 may be spaced apart from the gate structure 160 and the plurality of channel layers 141, 142, and 143 by the passivation layer 155. The epitaxial layer 156 may include silicon (Si), and may include impurities having different elements and/or concentrations from those of the passivation layer 155. An upper portion of the epitaxial layer 156 may include impurities having a concentration higher than that of a lower portion of the epitaxial layer 156. The epitaxial layer 156 may have an N-type conductivity, and may be an epitaxially grown layer. For example, the epitaxial layer 156 may include one of phosphorus (P) and arsenic (As), as a doping element.

FIG. 2C illustrates germanium (Ge) concentration profiles of the passivation layer 155 and the plurality of channel layers 141, 142, and 143 in the source/drain region 150 along IV-IV', a vertical line in a Z-direction in FIG. 2B. In the graph of FIG. 2C, a horizontal axis represents a depth from IV to IV', and a vertical axis represents a germanium (Ge) concentration. In a region corresponding to each of the passivation layer 155 and the plurality of channel layers 141, 142, and 143, an impurity concentration may have a substantially constant value. A germanium (Ge) concentration in a region corresponding to each of the plurality of channel layers 141, 142, and 143 may be relatively higher than a germanium (Ge) concentration in a region corresponding to the passivation layer 155. According to an example embodiment, a germanium (Ge) concentration of each of the plurality of channel layers 141, 142, and 143 may satisfy a range of about 15 at % to about 40 at %, and a germanium (Ge) concentration of the passivation layer 155 may be about 10 at % or less. The term such as "about" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0% to 5% deviation around 0.1 and a 0% to 5% deviation around 1, especially if such deviation maintains the same effect as the listed range. Accordingly, germanium (Ge) may be diffused at a boundary between the plurality of channel layers 141, 142, and 143, and the passivation layer 155. In the present specification, a "constant" concentration may refer to not only a case where a concentration is completely constant, but also a case where a slight difference occurs due to an error in a manufacturing process or the like, despite the same manufacturing process being performed.

The semiconductor device 100 according to example embodiments may have low power and high performance through the plurality of channel layers 141, 142, and 143 formed of silicon germanium (SiGe) and the source/drain region 150 having the above-described structure.

In order to improve the performance of a semiconductor device, a channel layer formed of silicon germanium (SiGe) may be used in a FinFET structure. Thus, the semiconductor device may have low power and high performance. Accordingly, the source/drain region 150 according to example embodiments may have the above-described structural features, thereby improving the performance of the semiconductor device even in an MBCFET structure. In particular, the substrate insulating layer 111 and the passivation layer 155 may be disposed using a channel layer formed of silicon germanium (SiGe) to protect the substrate 101 and the epitaxial layer 156 in a process of removing the sacrificial layer 120 formed of silicon (Si) described with reference to FIG. 9G, thereby improving the performance of the semiconductor device 100.

The gate structure 160 may intersect the active region 105 and the channel structures 140 on upper portions of the active region 105 and the channel structures 140 to extend in a direction, for example, the Y-direction. Channel regions of transistors may be formed in the active region 105 and the channel structures 140 intersecting the gate structure 160. The gate structure 160 may include the gate electrode layer 163, the gate dielectric layer 162 between the gate electrode layer 163 and the plurality of channel layers 141, 142, and 143, spacer layers 161 on side surfaces of the gate electrode layer 163, and a gate capping layer 164 on an upper surface of the gate electrode layer 163. The gate structure 160 may include an upper portion on the uppermost channel layer among the plurality of channel layers 141, 142, and 143, and the lower portion 160B below each of the plurality of channel layers 141, 142, and 143. The lowermost portion of the lower portion 160B of the gate structure 160 may be in contact with the substrate insulating layer 111.

The gate dielectric layer 162 may be disposed between the active region 105 and the gate electrode layer 163 and between the channel structure 140 and the gate electrode layer 163, and may be disposed to cover at least a portion of surfaces of the gate electrode layer 163. For example, the gate dielectric layer 162 may be disposed to surround all surfaces except an uppermost surface of the gate electrode layer 163. The gate dielectric layer 162 may extend between the gate electrode layer 163 and the spacer layers 161, but example embodiments are not limited thereto. A lower surface of the gate dielectric layer 162 surrounding the lowermost gate electrode of the gate structure 160 may be in contact with an upper surface of the substrate insulating layer 111. The gate dielectric layer 162 may include an oxide, a nitride, or a high-κ material. The high-κ material may refer to a dielectric material having a dielectric constant higher than that of a silicon oxide film ($SiO_2$). The high dielectric constant material may be, for example, one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate electrode layer 163 may be disposed on an upper portion of the substrate insulating layer 111 to fill spaces between the plurality of channel layers 141, 142, and 143, and extend to an upper portion of the channel structure 140. The gate electrode layer 163 may be spaced apart from the plurality of channel layers 141, 142, and 143 by the gate dielectric layer 162. The gate electrode layer 163 may include a conductive material. For example, at least one of a metal nitride (for example, at least one of a titanium nitride film (TiN), a tantalum nitride film (TaN), and a tungsten nitride film (WN)), a metal material (for example, aluminum (Al), tungsten (W), and molybdenum (Mo)), and silicon (for example, doped polysilicon) may be included The gate electrode layer 163 may be formed of two or more multilayers. The spacer layers 161 may be disposed on opposite side surfaces of the gate electrode layer 163. The spacer layers 161 may insulate the source/drain region 150 from the gate electrode layer 163. The spacer layers 161 may have a multilayer structure in some example embodiments. The spacer layers 161 may include at least one of an oxide, a nitride, an oxynitride, and a low-κ dielectric.

The gate capping layer 164 may be disposed on an upper portion of the gate electrode layer 163, and a lower surface thereof may be surrounded by the gate electrode layer 163 and the spacer layers 161.

The interlayer insulating layer 190 may be disposed to cover the source/drain region 150, the gate structure 160, and the device isolation layer 110. The interlayer insulating layer 190 may include, for example, at least one of an oxide, a nitride, an oxynitride, and a low-κ dielectric.

The contact plug 180 may pass through the interlayer insulating layer 190 to be connected to the source/drain region 150, and may apply an electrical signal to the source/drain region 150. The contact plug 180 may be disposed on the source/drain region 150, and may be disposed to have a length in the Y-direction longer than that of the source/drain region 150 in some example embodiments. The contact plug 180 may have an inclined side surface having a lower width becoming narrower than an upper width according to an aspect ratio, but example embodiments are not limited thereto. The contact plug 180 may be disposed to recess the source/drain region 150 to a predetermined depth. The contact plugs 180 may include a metal-semiconductor compound layer 182 disposed below, a barrier layer 184 disposed along sidewalls, and a plug conductive layer 186. The metal-semiconductor compound layer 182 may be, for example, a metal silicide layer. The barrier layer 184 may include, for example, a metal nitride such as a titanium nitride film (TiN), a tantalum nitride film (TaN), or a tungsten nitride film (WN). The plug conductive layer 186 may include, for example, a metal material such as aluminum (Al), tungsten (W), or molybdenum (Mo). In an example embodiment, the contact plug 180 may be disposed to pass through at least a portion of the source/drain region 150.

FIGS. 3A, 4A, 5A, 6, and 7 are cross-sectional views illustrating a semiconductor device according to example embodiments.

Figure 3A:
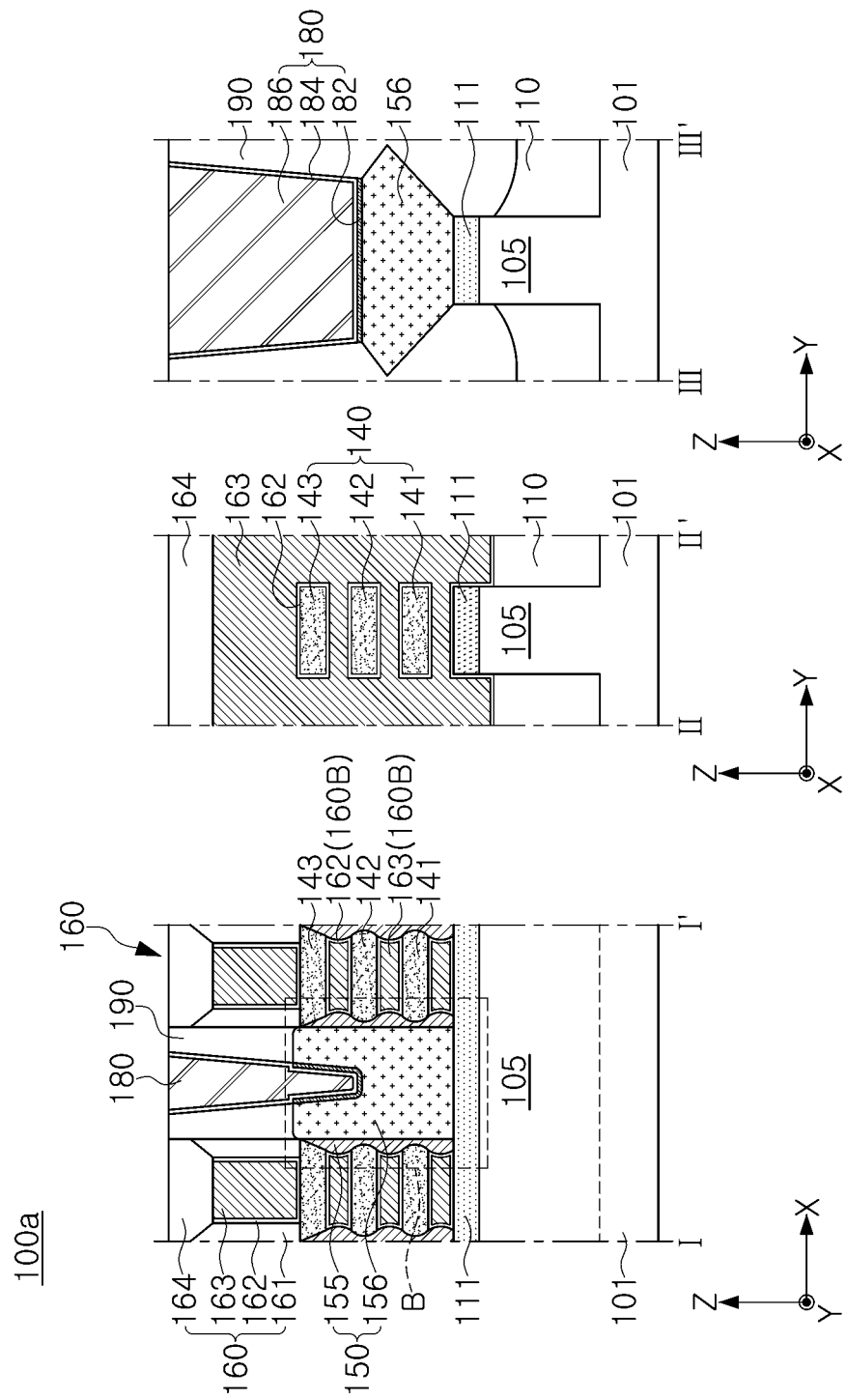
FIG. 3A is a cross-sectional view illustrating a semiconductor device according to example embodiments.
Figure 3B:
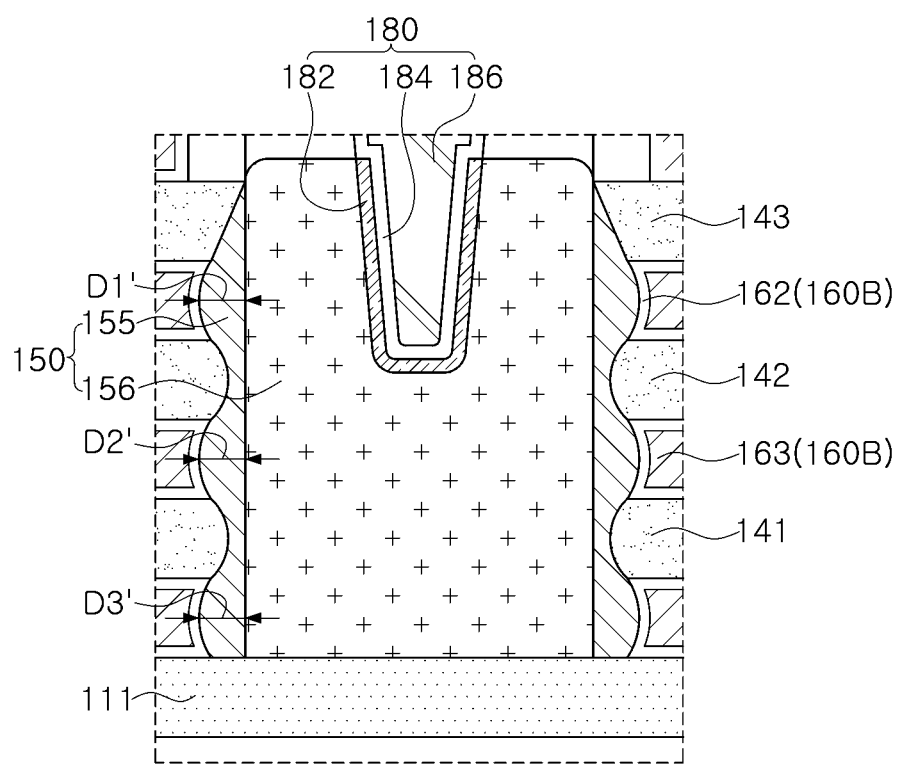
FIG. 3B is a partially enlarged view illustrating a portion of a semiconductor device according to example embodiments.
Figure 4A:
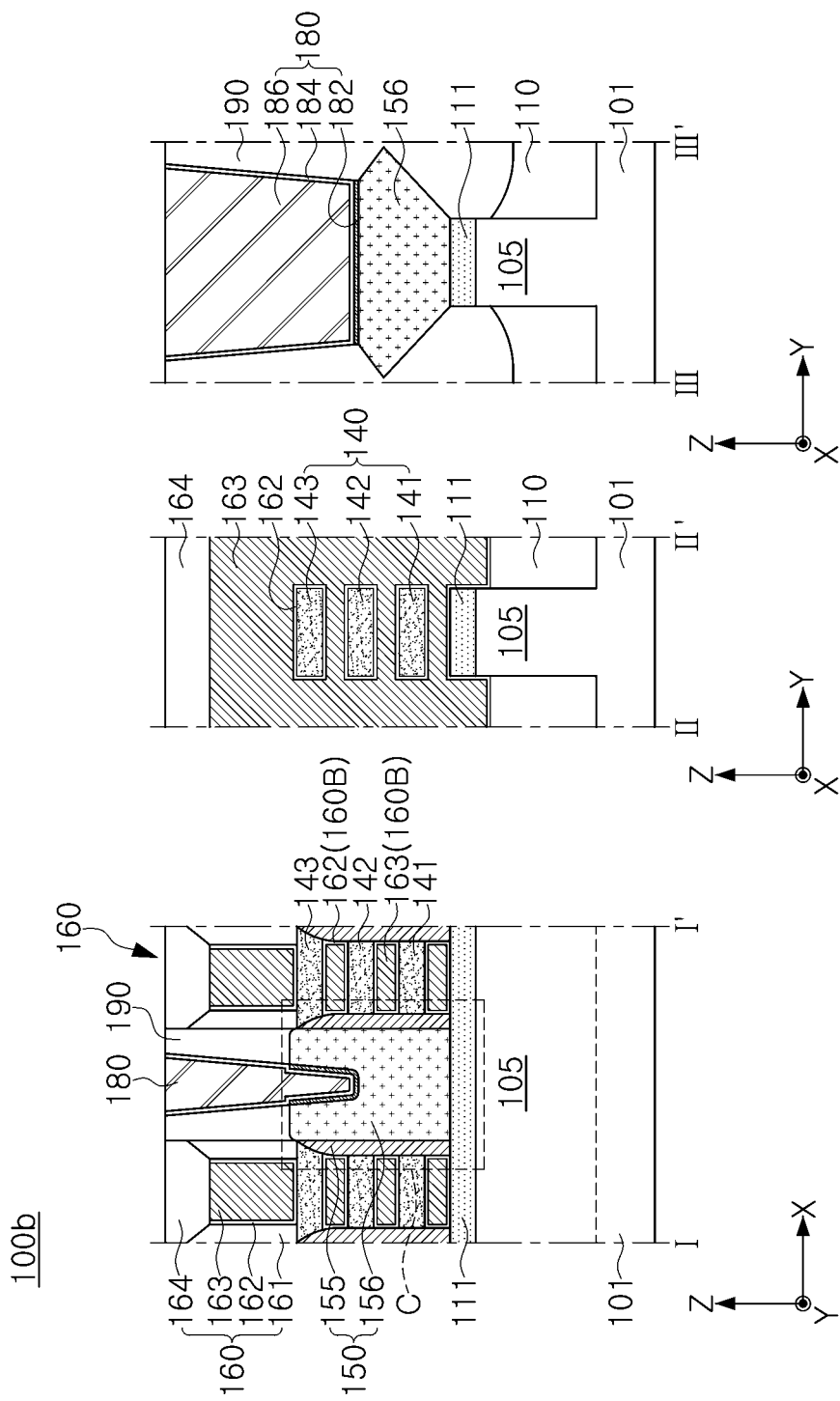
FIG. 4A is a cross-sectional view illustrating a semiconductor device according to example embodiments.
Figure 4B:
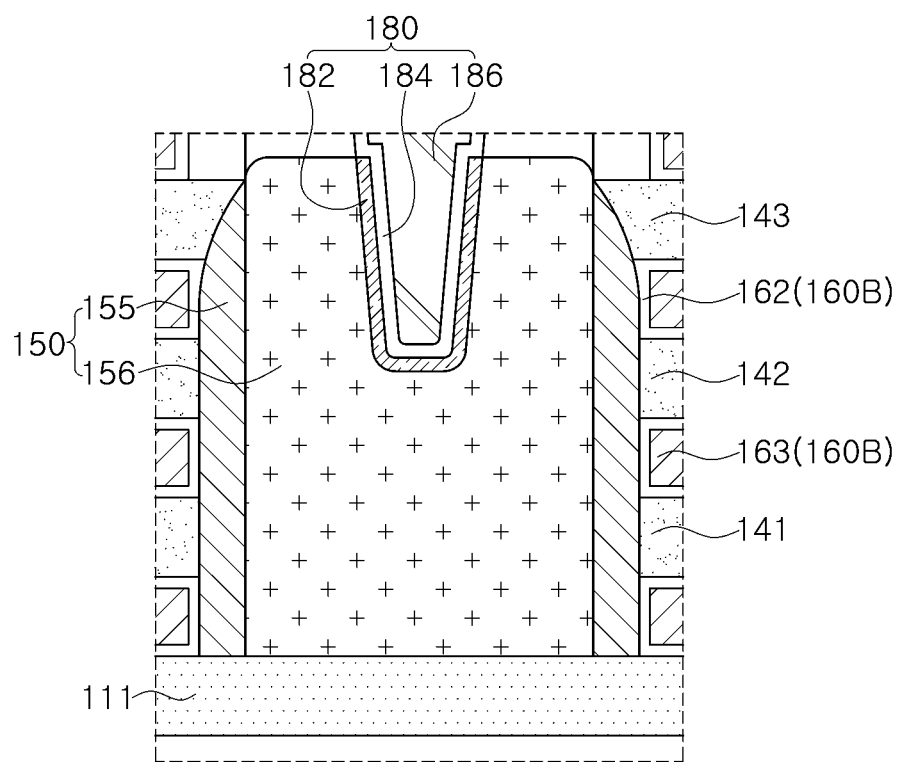
FIG. 4B is a partially enlarged view illustrating a portion of a semiconductor device according to example embodiments.
Figure 5A:
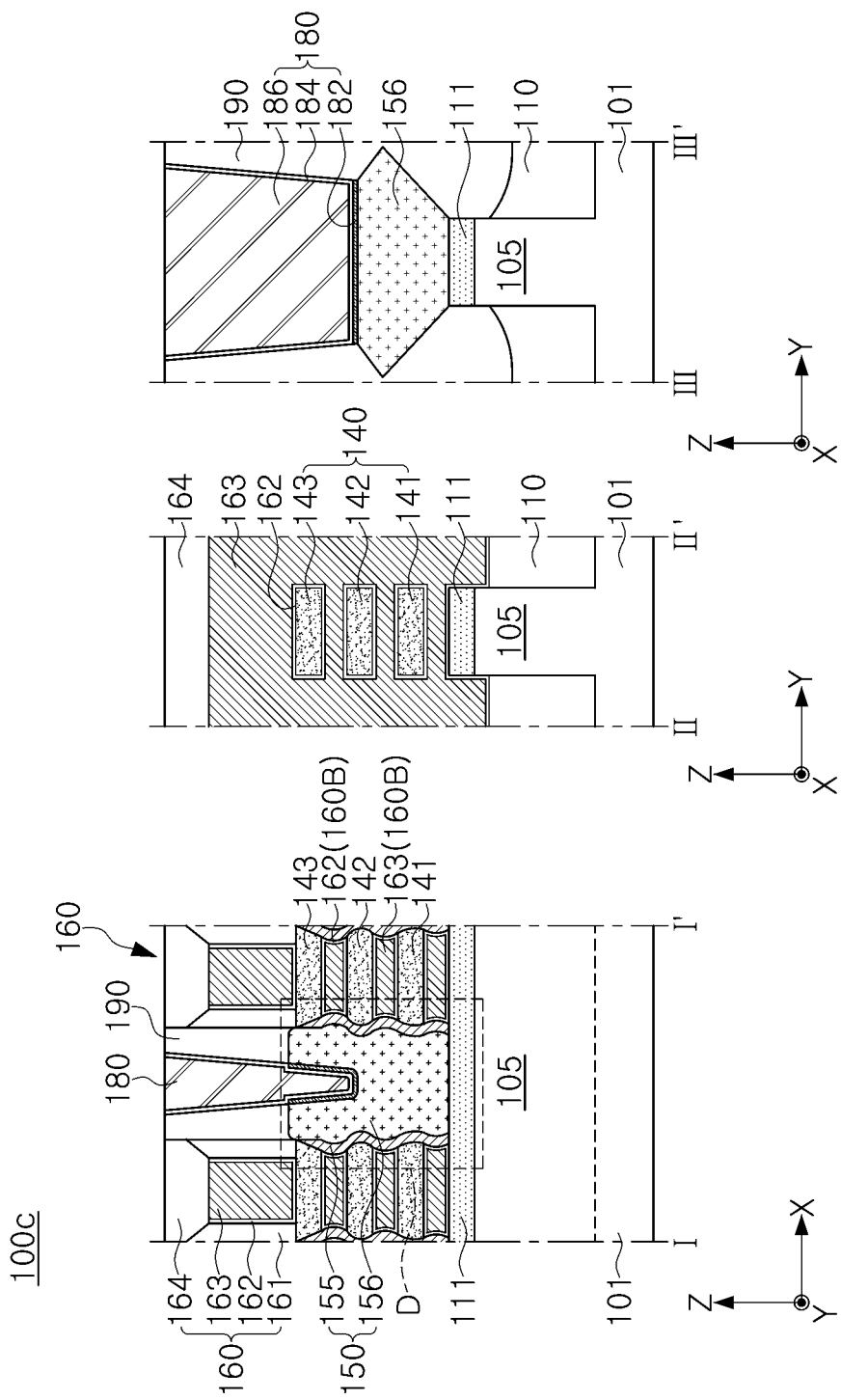
FIG. 5A is a cross-sectional view illustrating a semiconductor device according to example embodiments.
Figure 5B:
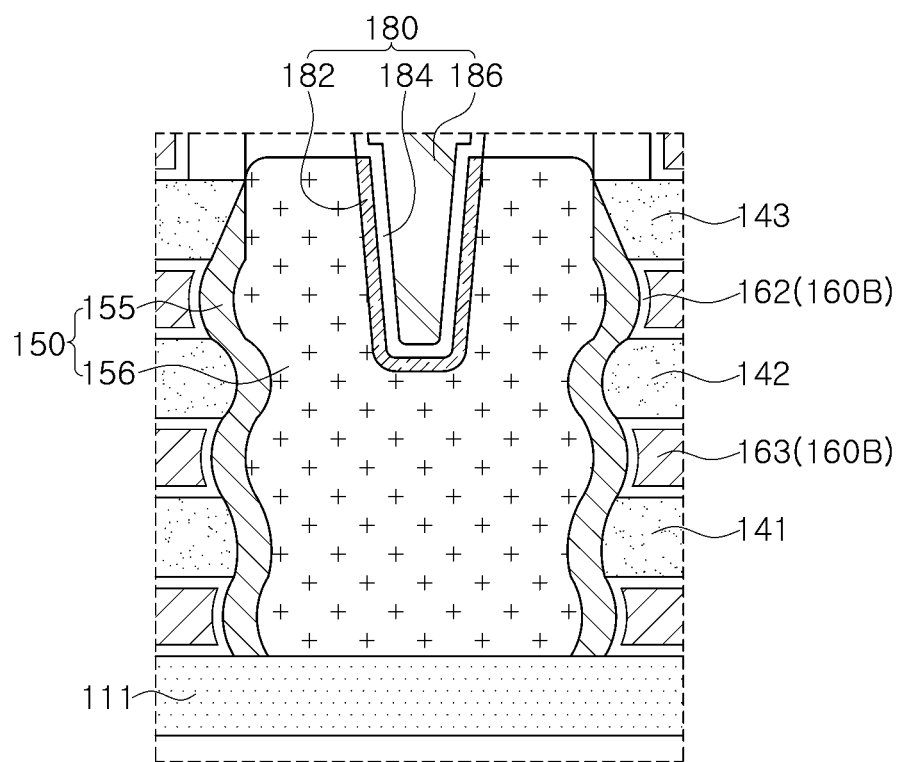
FIG. 5B is a partially enlarged view illustrating a portion of a semiconductor device according to example embodiments.

FIGS. 3B, 4B, and 5B are partially enlarged views illustrating a portion of a semiconductor device according to example embodiments. FIG. 3B illustrates an enlarged view of region B of FIG. 3A. FIG. 4B illustrates an enlarged view of region C of FIG. 4A. FIG. 5B illustrates an enlarged view of region D of FIG. 5A.

In FIGS. 3A, 3B, 4A, 4B, 5A, 5B, 6, and 7, reference numerals the same as those of FIG. 2A represent corresponding components, and a description overlapping the above description will be omitted.

Referring to FIGS. 3A and 3B, in a semiconductor device 100*a*, horizontal widths D1', D2', and D3' of protrusions of the passivation layers 155 may be substantially the same. For example, among recessed regions of the lower portion 160B of the gate structure 160, a horizontal width D3' of the lowermost portion, a horizontal width D2' between the lowermost portion and the uppermost portion, and a horizontal width D1' of the uppermost portion may be substantially the same. Such a shape is not limited and may vary depending on example embodiments. In the present specification, a concentration, thickness, or the like being "substantially" the same includes not only a case where the concentration, thickness, or the like are completely the same, but also a case where a slight difference occurs due to an error in a manufacturing process or the like even when components are formed through the same manufacturing process, and may be interpreted to have the same meaning even when the term "substantially" is omitted.

Referring to FIGS. 4A and 4B, in a semiconductor device 100*b*, the passivation layers 155 may be in contact with the plurality of channel layers 141, 142, and 143, and the lower portion 160B of the gate structure 160, and a contact surface thereof may form a surface, perpendicular to an upper surface of the substrate 101. According to an example embodiment, the passivation layers 155 may be formed of silicon germanium (SiGe), and thus may have etch selectivity with respect to the sacrificial layer 120 formed of silicon (Si). Accordingly, the passivation layers 155 may protect the epitaxial layer 1156 in a process of removing the sacrificial layer 120.

Referring to FIGS. 5A and 5B, in a semiconductor device 100*c*, unlike the example embodiment of FIG. 2A, a contact surface of the passivation layers 155 and the epitaxial layer 156 may not form a surface, perpendicular to the upper surface of the substrate 101. Specifically, the contact surface of the epitaxial layer 156 and the passivation layers 155 may be recessed to a predetermined depth in the first direction X of the lower portion 160B of the gate structure 160, and thus may have an inwardly concave shape. The epitaxial layer 156 may be disposed in recessed regions of the passivation layers 155. The passivation layers 155 according to the present example embodiment may have a relatively thin thickness as compared to the example embodiment of FIG. 2A, but example embodiments are not limited thereto.

Figure 6:
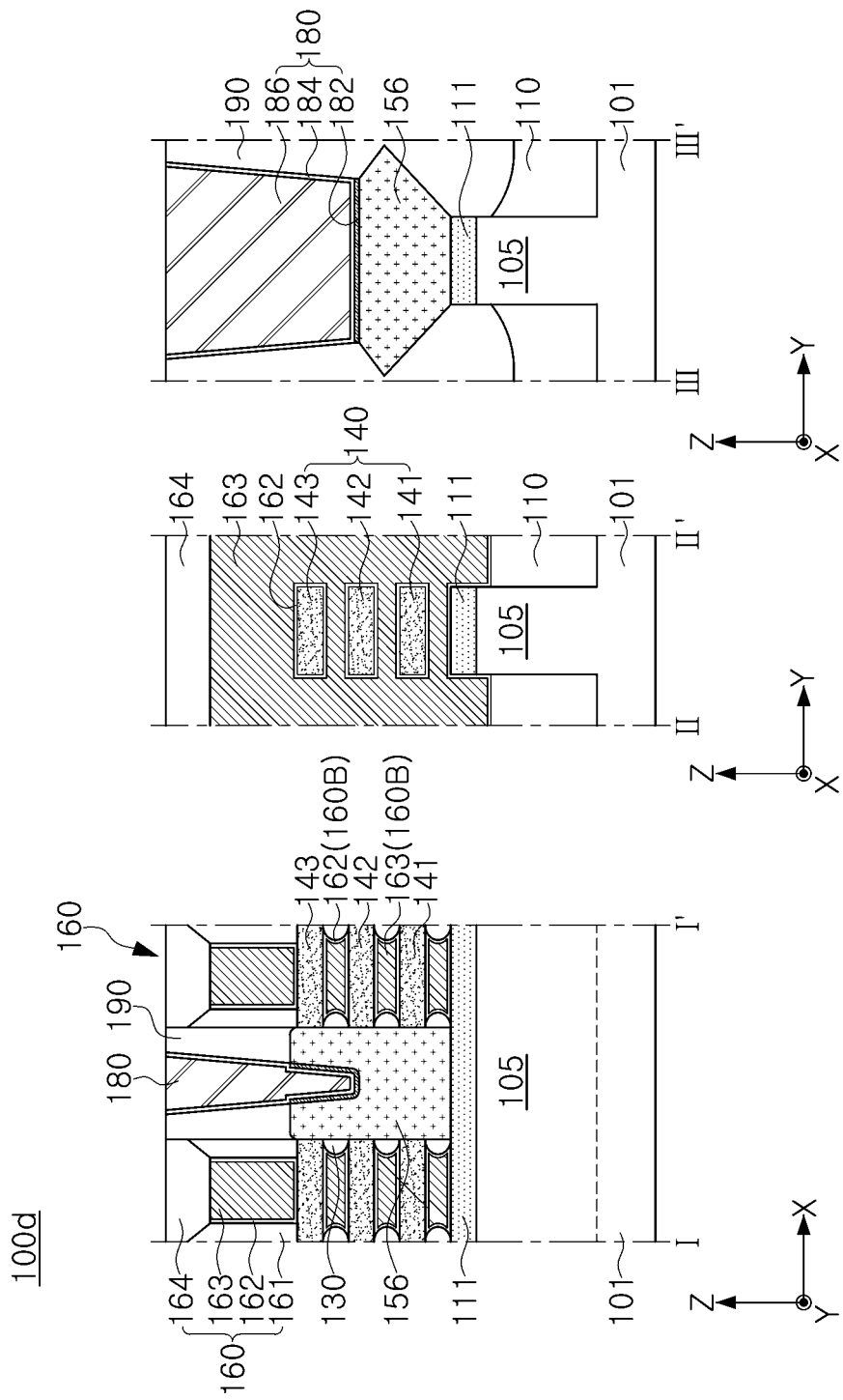
FIG. 6 is a cross-sectional view illustrating a semiconductor device according to example embodiments.

Referring to FIG. 6, in a semiconductor device 100*d*, unlike the example embodiment of FIG. 2A, inner spacer layers 130 may be included without the passivation layers 155. The inner spacer layers 130 may be disposed in parallel with the gate electrode layer 163 between the channel structures 140. Below the third channel layer 143, the gate electrode layer 163 may be spaced apart from the source/drain regions 150 by the inner spacer layers 130 to be electrically isolated from the source/drain region 150. The inner spacer layers 130 may have a shape in which a side surface facing the gate electrode layer 163 is inwardly rounded convexly toward the gate electrode layer 163, but example embodiments are not limited thereto. The inner spacer layers 130 may be formed of an oxide, a nitride, or an oxynitride, and in particular, a low-κ film.

Figure 9B:
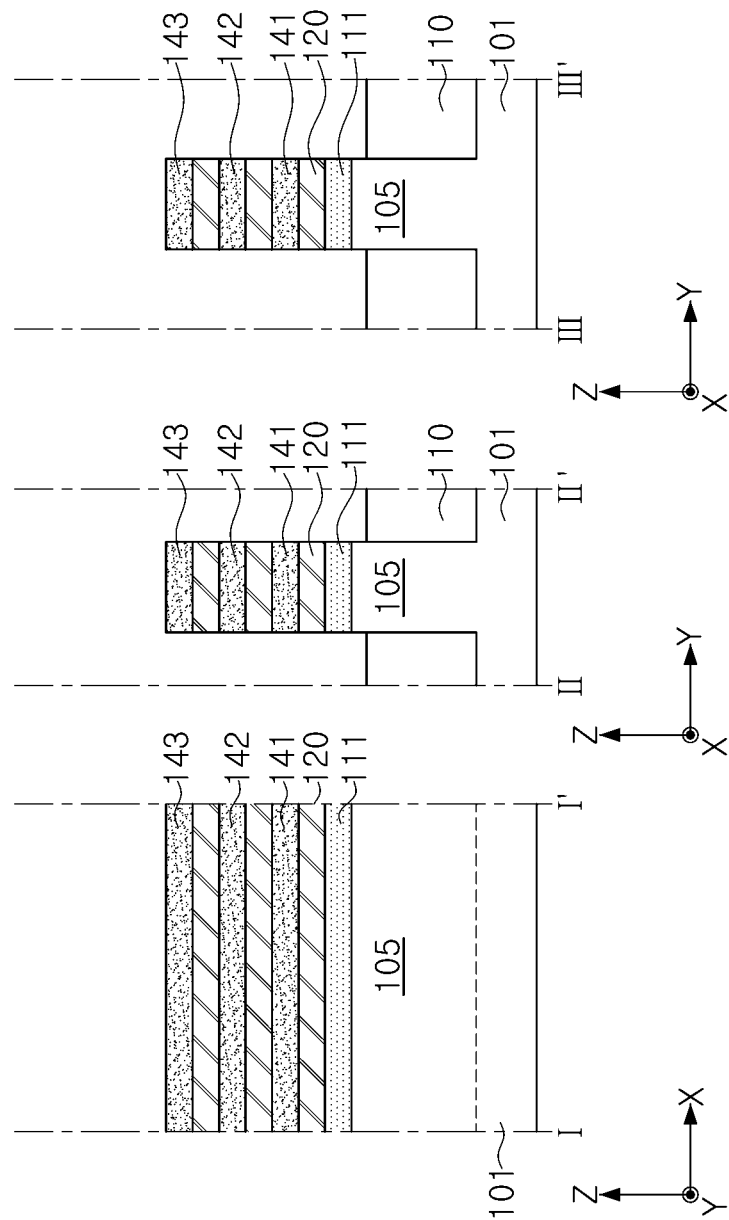
Figure 9C:
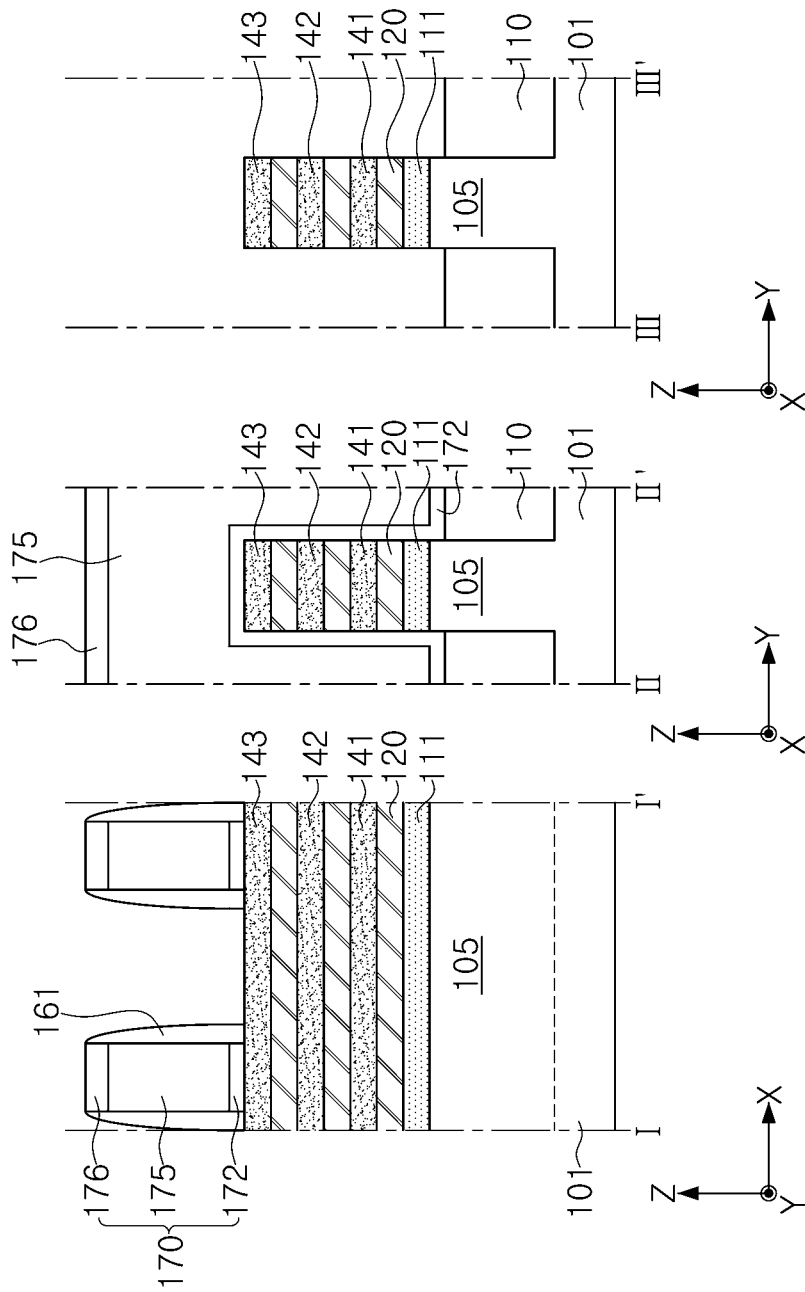
Figure 9D:
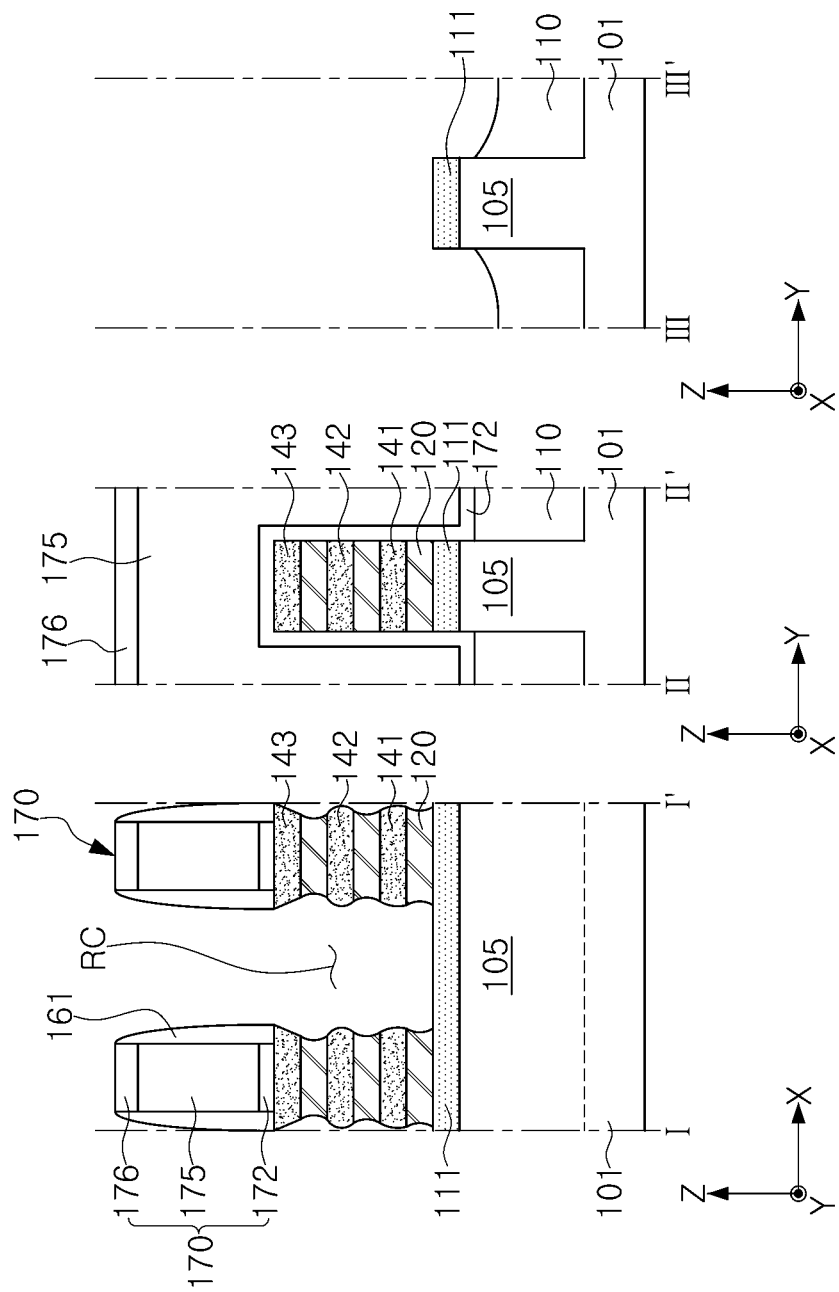

The inner spacer layers 130 may be formed in a region from which the sacrificial layers 120 are removed before the epitaxial layer 156 is formed (see FIG. 9D). The inner spacer layers 130 may be formed by filling an insulating material in the region from which the sacrificial layers 120 are removed and removing the insulating material deposited on the outside of the channel structures 140. The inner spacer layers 130 may be formed of a material the same as that of the spacer layers 161, but example embodiments are not limited thereto. For example, the inner spacer layers 130 may include at least one of SiN, SiCN, SiOCN, SiBCN, and SiBN.

The inner spacer layers 130 may also be applied to other example embodiments.

Figure 7:
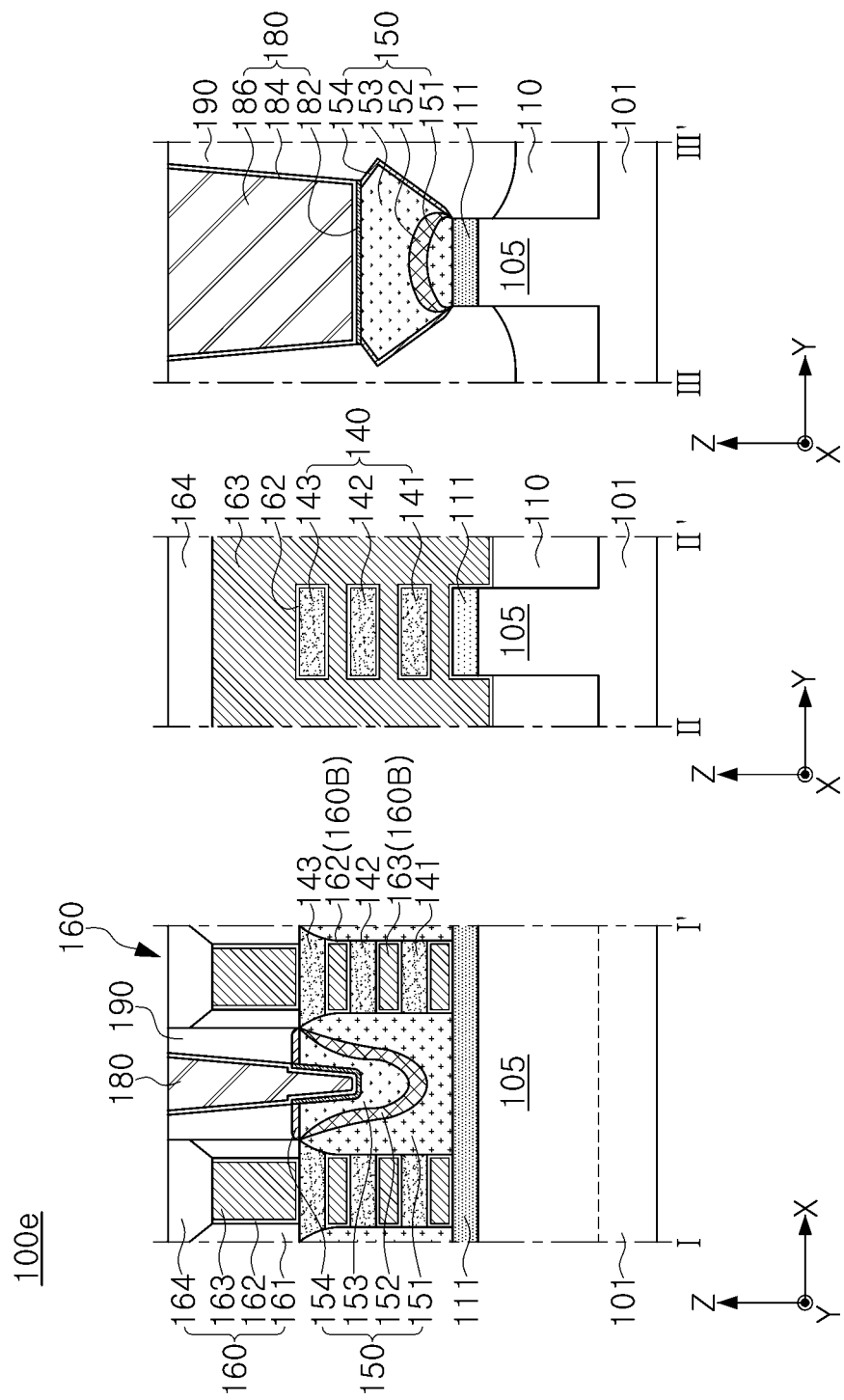
FIG. 7 is a cross-sectional view illustrating a semiconductor device according to example embodiments.

Referring to FIG. 7, in a semiconductor device 100*e*, the source/drain region 150 may include a plurality of epitaxial layers, for example, first to fourth epitaxial layers 151, 152, 153, and 154. In the present specification, first to fourth layers of the claims may be referred to as the first to fourth epitaxial layers 151, 152, 153, and 154.

The first epitaxial layer 151 may be disposed on the active region 105, and may extend to be in contact with the plurality of channel layers 141, 142, and 143. The first epitaxial layer 151 may be in contact with the lower portion 160B of the gate structure 160 disposed on each of lower portions of the channel layers 141, 142, and 143. Each side surface of the lower portion 160B of the gate structure 160 and side surfaces of the plurality of channel layers 141, 142, and 143 may be coplanar with the upper surface of the substrate 101 in a vertical direction. The lowermost surface of the source/drain region 150 may be in contact with the substrate insulating layer 111 to form a flat surface, and the source/drain region 150 may be spaced apart from the substrate 101 by the substrate insulating layer 111.

The first epitaxial layer 151 among a plurality of epitaxial layers 151, 152, 153, and 154 may cover the side surfaces of the plurality of channel layers 141, 142, and 143, each side surface of the lower portion 160B of the gate structure 160, and an upper surface of the substrate insulating layer 111. The first epitaxial layer 151 may have a recessed shape. The first epitaxial layer 151 may have an approximately U-shape.

The first epitaxial layer 151 may include silicon germanium (SiGe) doped with a group III element, and may have a P-type conductivity. For example, the first epitaxial layer 151 may include one of boron (B), aluminum (Al), gallium (Ga), indium (In), and thallium (Tl), as a doping element. A germanium (Ge) concentration of the first epitaxial layer 151 may be lower than that of the sacrificial layer 120 before the gate structure 160 is substituted. The first epitaxial layer 151 may have a etch selectivity lower than that of the sacrificial layer 120 under a specific etching condition during a manufacturing process. Due to a difference in etch selectivity, the sacrificial layer 120 may be selectively removed in a process of removing the sacrificial layer 120, and the source/drain region 150 surrounded by the first epitaxial layer 151 may remain.

The second epitaxial layer 152 may be disposed on the first epitaxial layer 151. The second epitaxial layer may have an approximately U-shaped rounded shape, but example embodiments are not limited thereto.

The third epitaxial layer 153 may be disposed on the second epitaxial layer 152. The third epitaxial layer 153 may be disposed to completely fill a recessed region of the source/drain region 150.

The first to third epitaxial layers 151, 152, and 153 may have different germanium (Ge) concentrations. The germanium (Ge) concentration may increase in an order of the first epitaxial layer 151, the second epitaxial layer 152, and the third epitaxial layer 153. For example, the first epitaxial layer 151 may include first silicon germanium (SiGe) including germanium (Ge) having a first concentration, the second epitaxial layer 152 may include second silicon germanium (SiGe) including germanium (Ge) having a second concentration higher than the first concentration, and the third epitaxial layer 153 may include third silicon germanium (SiGe) including germanium (Ge) having a third concentration higher than the second concentration.

The fourth epitaxial layer 154 may include silicon (Si) doped with a group III element. For example, the fourth epitaxial layer 154 may include one of boron (B), aluminum (Al), gallium (Ga), indium (In), and thallium (Tl). In an example embodiment, the fourth epitaxial layer 154 may include silicon (Si) doped with boron (B), and germanium (Ge) may not be substantially included in the fourth epitaxial layer 154. The fourth epitaxial layer 154 may be a passivation layer capping the first to third epitaxial layers 151, 152, and 153. At least a portion of the fourth epitaxial layer 154 may be formed on a level higher than that of an upper surface of the uppermost channel layer 143, but example embodiments are not limited thereto.

The first to fourth epitaxial layers 151, 152, 153, and 154 may have different material compositions (for example, a concentration of Ge), and thus may be substantially distinguished from each other through analysis such as transmission electron microscopy energy-dispersive x-ray spectroscopy (TEM-EDS) or the like.

According to an example embodiment, the semiconductor device 100e may further include the inner spacer layers 130 of FIG. 6.

Figure 8:
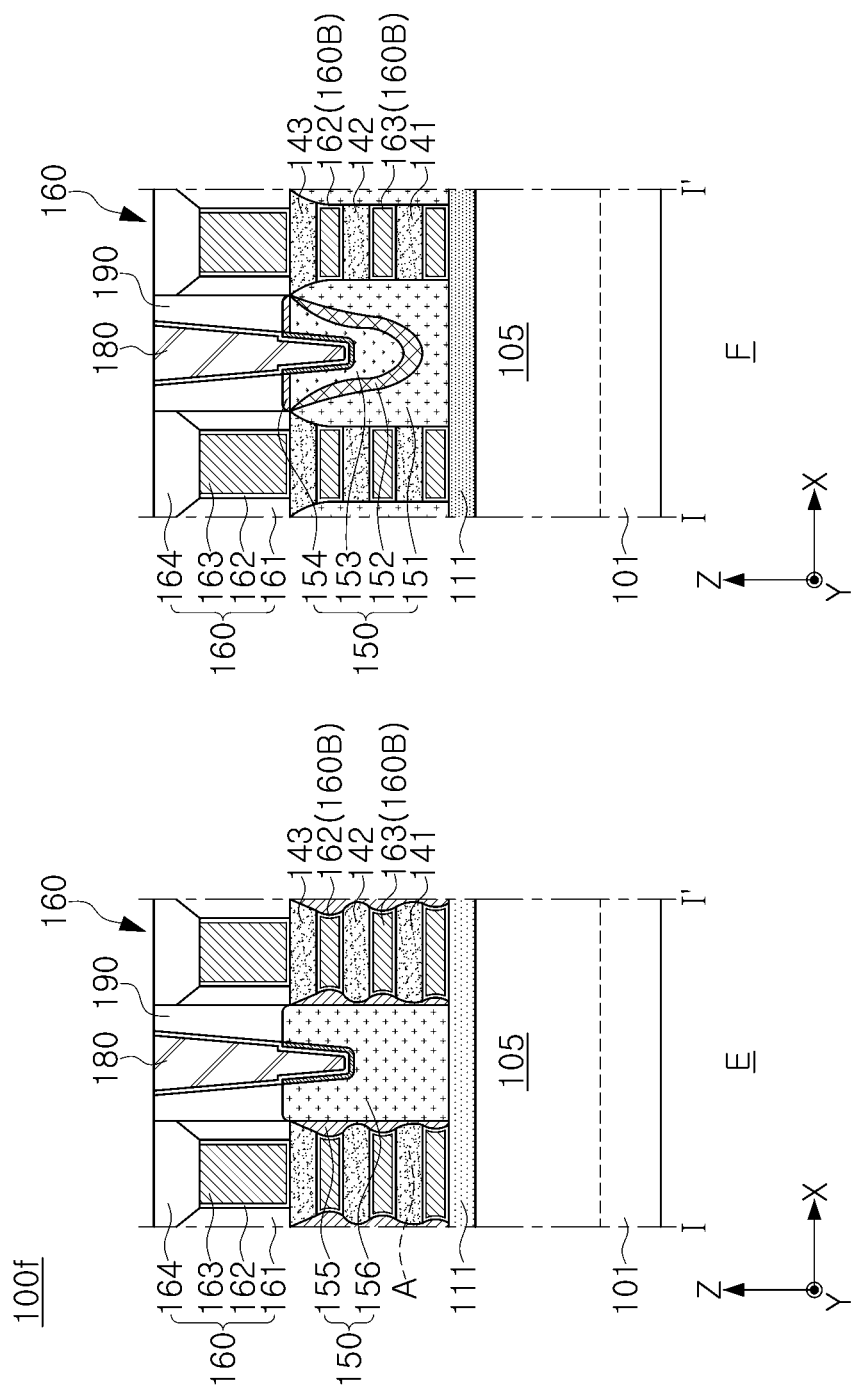
FIG. 8 is a cross-sectional view illustrating a semiconductor device according to example embodiments.

FIG. 8 is a cross-sectional view illustrating a semiconductor device according to example embodiments.

Referring to FIG. 8, a semiconductor device 100f may include a first region E and a second region F. The first region E may be, for example, a region in which NMOS transistors are disposed, and the second region F may be, for example, a region in which PMOS transistors are disposed. The first region E and the second region F may be disposed to be adjacent to each other or spaced apart from each other.

The description above with reference to FIG. 2A may be equally applied to a transistor in the first region E, and the description above with reference to FIG. 7 may be equally applied to a transistor in the second region F.

FIGS. 9A to 9J are cross-sectional views according to a process order so as to describe a method of manufacturing a semiconductor device according to example embodiments. FIGS. 9A to 9J, diagrams illustrating an example embodiment of a method of manufacturing the semiconductor device of FIGS. 1 and 2A to 2C, illustrate cross-sections corresponding to FIG. 2A.

Referring to FIG. 9A, the substrate insulating layer 111 may be disposed on the substrate 101, and the sacrificial layers 120 and the channel layers 141, 142, and 143 may be alternately stacked on the substrate insulating layer 111.

The substrate insulating layer 111 may be formed on the substrate 101 through high-temperature annealing after an ion implantation process. For example, an oxygen ion may be implanted.

The sacrificial layers 120 may be replaced by the gate dielectric layer 162 and the gate electrode layer 163 through subsequent processes, as illustrated in FIG. 2A. The sacrificial layers 120 may be formed of a material having etch selectivity with respect to the channel layers 141, 142, and 143. The channel layers 141, 142, and 143 may include a material different from that of the sacrificial layers 120. In an example embodiment, the channel layers 141, 142, and 142 may include silicon (SiGe), and the sacrificial layers 120 may include silicon (Si).

The sacrificial layers 120 and the channel layers 141, 142, and 143 may be formed by performing an epitaxial growth process, using the lowermost layer among the sacrificial layers 120 as a seed. Each of the sacrificial layers 120 and the channel layers 141, 142, and 143 may have a thickness having a range of about 1 Å to 100 nm. The number of layers of the channel layers 141, 142, and 143 alternately stacked with the sacrificial layer 120 may be changed in various manners in example embodiments.

Referring to FIG. 9B, active structures may be formed by removing portions of a stacked structure of the sacrificial layers 120 and the channel layers 141, 142, and 143, the substrate insulating layer 111, and the substrate 101.

The active structure may include the sacrificial layers 120 and the channel layers 141, 142, and 143 alternately stacked with each other, and may further include the active region 105 formed to protrude from an upper surface of the substrate 101 by removed portions of the substrate insulating layer 111 and the substrate 101. The active structures may be formed to have a line shape extending in a direction, for example, an X-direction, and may be disposed to be spaced apart from each other in a Y-direction.

In a region from which portions of the substrate insulating layer 111 and the substrate 101 are removed, the device isolation layers 110 may be formed by filling and recessing an insulating material such that the active region 105 protrudes. Upper surfaces of the device isolation layers 110 may be formed to be lower than an upper surface of the active region 105.

Referring to FIG. 9C, sacrificial gate structures 170 and the spacer layers 161 may be formed on the active structures.

The sacrificial gate structures 170 may be sacrificial structures formed in a region in which the gate dielectric layer 162 and the gate electrode layer 163 are disposed on an upper portion of the channel structure 140, as illustrated in FIG. 2A, through subsequent processes. The sacrificial gate structure 170 may include first and second sacrificial gate layers 172 and 175 and a mask pattern layer 176 sequentially stacked. The first and second sacrificial gate layers 172 and 175 may be patterned using the mask pattern layer 176. The first and second sacrificial gate layers 172 and 175 may be an insulating layer and a conductive layer, respectively. For example, the first sacrificial gate layer 172 may include a silicon oxide, and the second sacrificial gate layer 175 may include polysilicon. The mask pattern layer 176 may include a silicon nitride. The sacrificial gate structures 170 may have a line shape intersecting the active structures and extending in a direction. The sacrificial gate structures 170 may extend, for example, in the Y-direction, and may be disposed to be spaced apart from each other in the X-direction.

The spacer layers 161 may be formed on opposite sidewalls of the sacrificial gate structures 170. The spacer layers 161 may be formed by forming a film having a uniform thickness along upper and side surfaces of the sacrificial gate structures 170 and the active structures, and then performing anisotropic etching. The spacer layers 161 may be formed of a low-κ material, and may include, for example, at least one of SiO, SiN, SiCN, SiOC, SiON, and SiOCN.

Referring to FIG. 9D, a recess region RC may be formed by removing the exposed sacrificial layers 120 and channel layers 141, 142, and 143 between the sacrificial gate structures 170, such that the channel structures 140 may be formed.

The active region 105 may be recessed to a predetermined depth from an upper surface thereof, such that the recessed region RC may be formed. The recess process may be formed by, for example, sequentially applying a dry etching process and a wet etching process. First, the recess region RC may be formed in a vertical direction through the dry etching process. Next, the recess region RC may be formed in a horizontal direction through the wet etching process.

In this case, the plurality of channel layers 141, 142, and 143 formed of silicon germanium (SiGe) have a etch selectivity lower than those of the sacrificial layers 120 formed of silicon (Si). Thus, a depth at which the recessed region RC is recessed in the first direction X below the sacrificial gate structures 170 may be different. For example, in the recess region RC, a width in the first direction X on a level of each of the sacrificial layers 120 may be greater than a width in the first direction X on a level of each of the first to third channel layers 141, 142, and 143. The remaining sacrificial layers 120 may be removed to a predetermined depth from a side surface thereof in the X-direction, and thus may have inwardly concave side surfaces. The side surfaces in the X-direction of the remaining channel layers 141, 142, and 143 may be etched, and thus may have an outwardly convex side surface.

Next, a degree of the sacrificial layer 120 being etched may be reduced as a distance to the substrate insulating layer 111 decreases. Thus, a width in the first direction X of the recess region RC on the level of each of the sacrificial layers 120 may be reduced as the distance to the substrate insulating layer 111 decreases.

However, the shapes of the side surfaces of the sacrificial layers 120 and the channel layers 141, 142, and 143, and the width in the first direction X on the level of each of the sacrificial layers 120 are not limited to those illustrated. The side surfaces of the sacrificial layers 120 and the channel layers 141, 142, and 143 may be formed to be coplanar in a direction, perpendicular to the upper surface of the substrate 101.

Figure 9E:
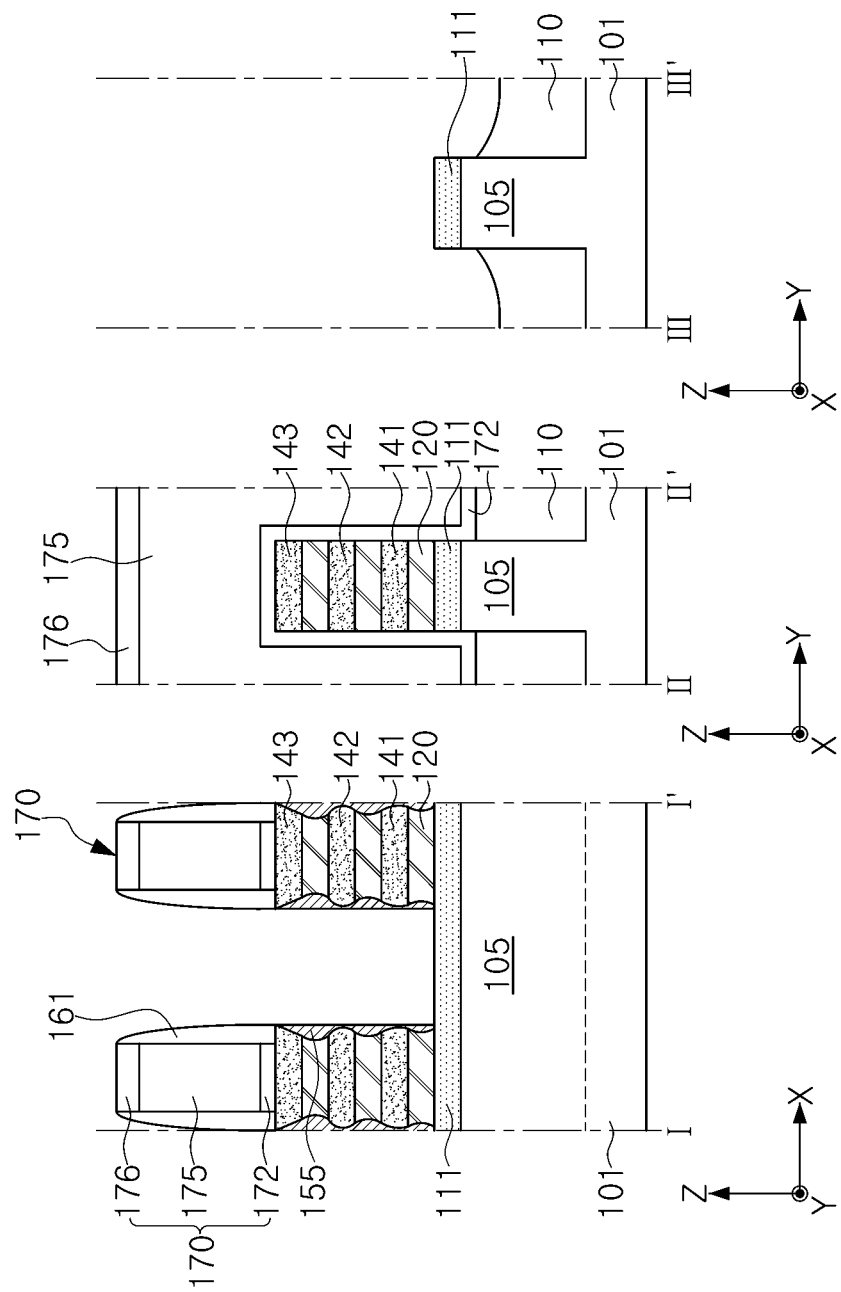

Referring to FIG. 9E, the passivation layers 155 may be formed in the recess region RC.

The passivation layers 155 may extend to be in contact with the channel layers 141, 142, and 143, and the sacrificial layers 120 in the recess region RC. Accordingly, the passivation layers 155 may partially expose the substrate insulating layer 111, and a surface facing the recess region RC among side surfaces of the passivation layers 155 may include a region extending in a direction, perpendicular to the upper surface of the substrate 101. Surfaces of the passivation layers 155 being in contact with the channel layers 141, 142, and 143 and the sacrificial layers 120 may have a wavy shape.

The passivation layers 155 may include silicon germanium (SiGe) doped with a group III element. In some example embodiments, the passivation layers 155 may include one of boron (B), aluminum (Al), gallium (Ga), indium (In), and thallium (Tl). The passivation layers 155 may be formed by supplying silicon (Si) and germanium (Ge) source gases under supply of a carrier gas. In an example embodiment, the carrier gas may be hydrogen ($H_2$) gas, the silicon (Si) source gas may be, for example, silane ($SiH_4$), dichlorosilane ($SiH_2Cl_2$) DCS or chlorosilane ($SiH_3Cl$) MCS, and the germanium (Ge) source gas may be, for example, germanium tetrahydride ($GeH_4$). The epitaxial layer 156 to be described below may be formed in a similar manner.

The passivation layers 155 may include germanium (Ge) having a concentration lower than those of the plurality of channel layers 141, 142, and 143. In an example embodiment, the passivation layers 155 may include germanium (Ge) having a concentration of greater than about 0 at % and less than or equal to about 10 at %, and the plurality of channel layers 141, 142, and 143 may include germanium (Ge) having a concentration of about 15 at % to about 40 at %. Accordingly, during a subsequent process described with reference to FIG. 9G, the epitaxial layer 156 may be protected by the passivation layers 155 in a process of removing the sacrificial layers 120.

Figure 9F:
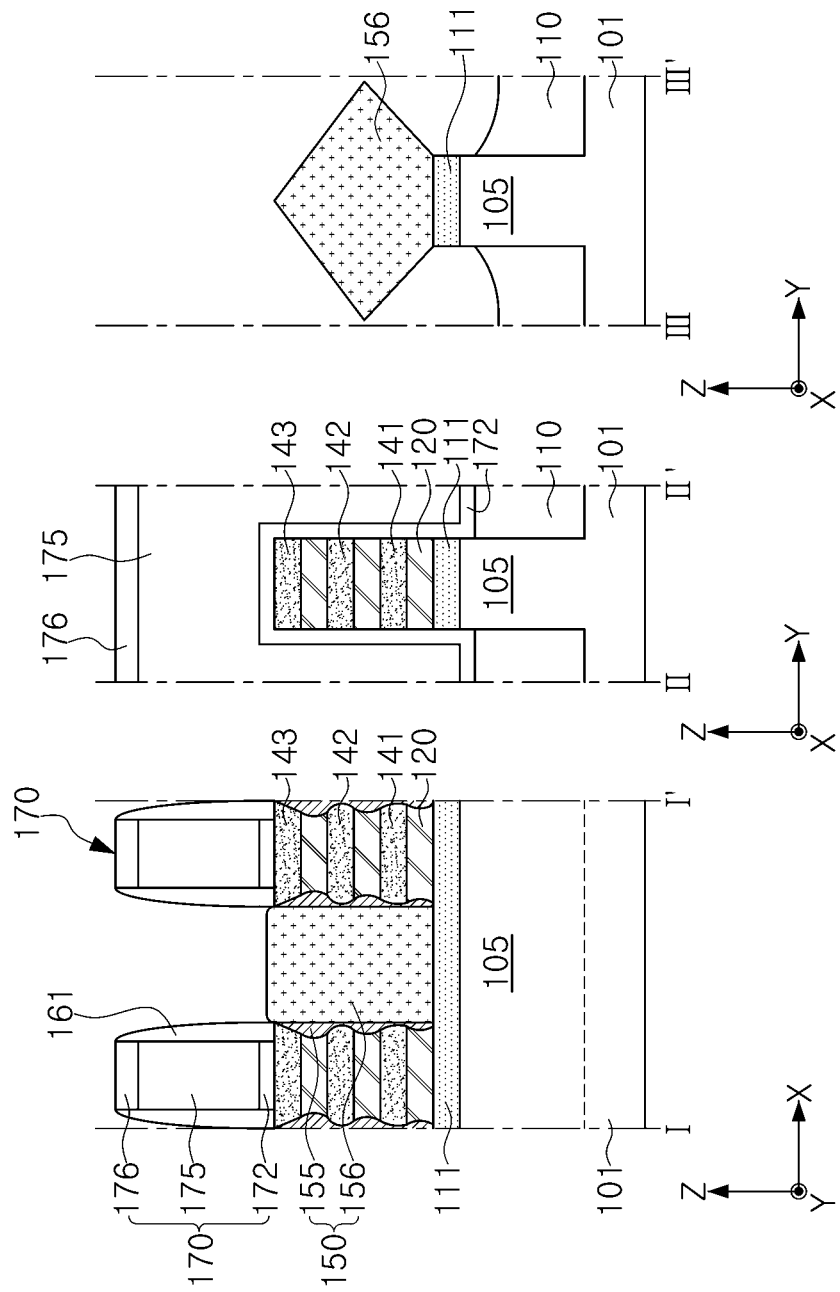

Referring to FIG. 9F, the source/drain region 150 may be formed to fill the recess region RC.

In the source/drain region 150, the epitaxial layer 156 may be formed by performing an epitaxial growth process using the passivation layers 155 as a seed. Accordingly, in the finally formed source/drain region 150, a boundary between the epitaxial layer 156 and the passivation layers 155 may not be identified on an electron micrograph. However, even in this case, the epitaxial layer 156 and the passivation layers 155 may have different material compositions, and thus may be substantially distinguished from each other by analyzing an impurity concentration through analysis such as transmission electron microscopy energy-dispersive x-ray spectroscopy (TEM-EDS) or the like.

Figure 9G:
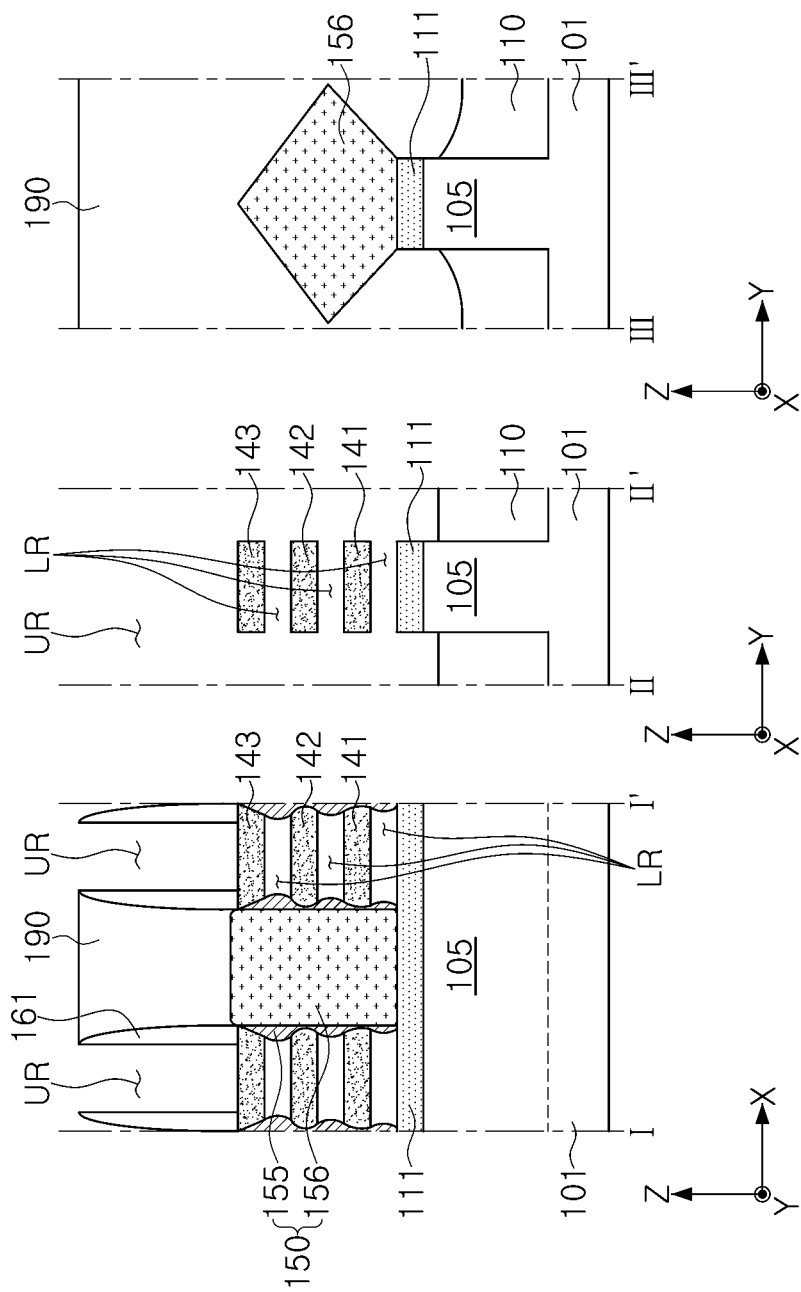

Referring to FIG. 9G, the interlayer insulating layer 190 may be formed, and the sacrificial layers 120 and the sacrificial gate structures 170 may be removed.

The interlayer insulating layer 190 may be formed by forming an insulating film covering the sacrificial gate structures 170 and the source/drain regions 150, and performing a planarization process.

The sacrificial layers 120 and the sacrificial gate structures 170 may be selectively removed with respect to the spacer layers 161, the interlayer insulating layer 190, and the plurality of channel layers 141, 142, and 143. First, upper gap regions UR may be formed by removing the sacrificial gate structures 170, and then the sacrificial layers 120 exposed through the upper gap regions UR may be removed to form lower gap regions LR. For example, the sacrificial gate structures 170 and the sacrificial layers 120 may be exposed in the Y-direction. During the removal process, the passivation layers 155 formed of silicon germanium (SiGe) may protect the epitaxial layer 156 by selective etching of the sacrificial layers 120 formed of silicon (Si). In other examples, when the sacrificial layers 120 include silicon germanium (SiGe) and the plurality of channel layers 141, 142, and 143 include silicon (Si), the sacrificial layers 120 may be selectively removed by performing a wet etching process using peracetic acid as an etchant.

Figure 9H:
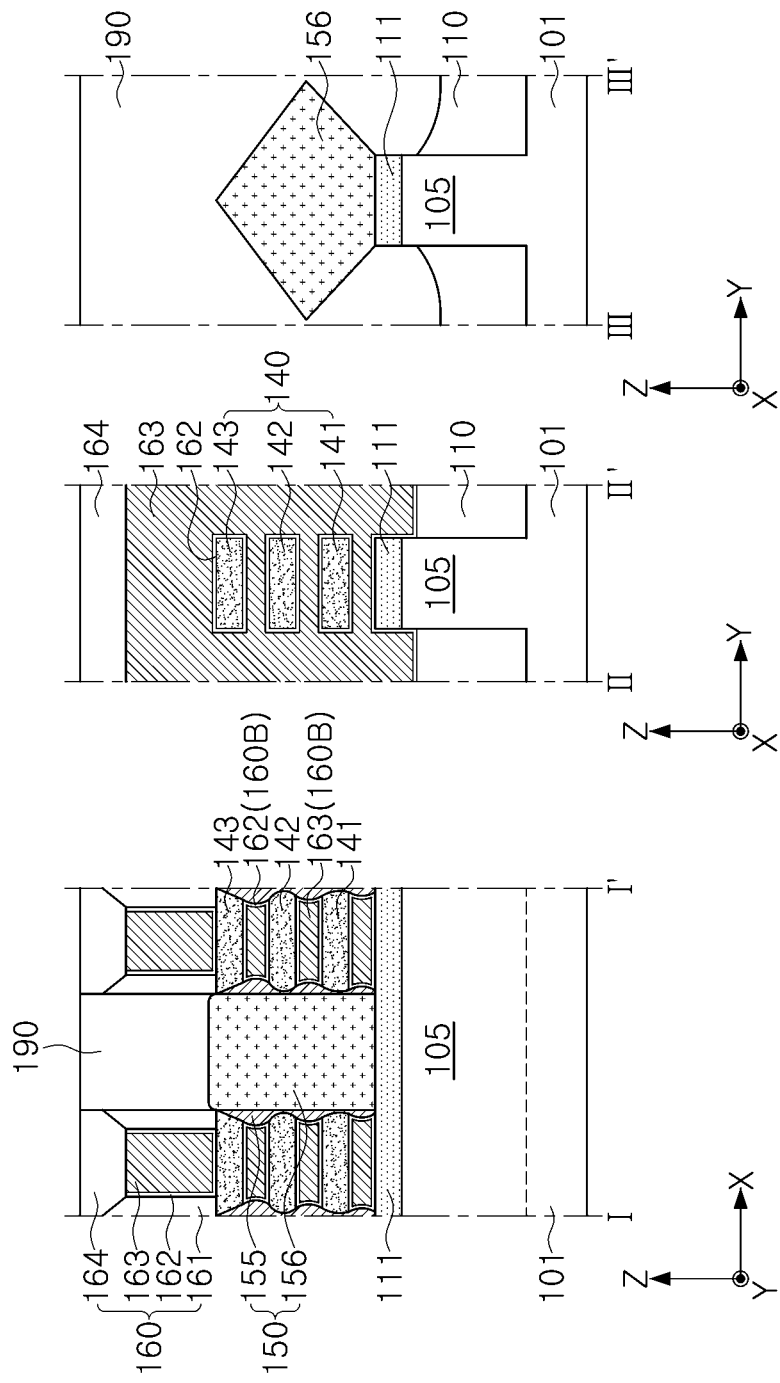

Referring to FIG. 9H, the gate structure 160 may be formed in the upper gap regions UR and the lower gap regions LR.

The gate dielectric layer 162 may be formed to conformally cover inner surfaces of the upper gap regions UR and the lower gap regions LR. The gate electrode layer 163 may be formed to completely fill the upper gap regions UR and the lower gap regions LR. The gate electrode layer 163 and the spacer layers 161 may be removed to a predetermined depth from upper portions thereof in the upper gap regions UR. The gate capping layer 164 may be formed in a region in which the gate electrode layer 163 and the spacer layers 161 are removed from the upper gap regions UR. Accordingly, the gate structure 160 including the gate dielectric layer 162, the gate electrode layer 163, the spacer layers 161, and the gate capping layer 164 may be formed.

Figure 9I:
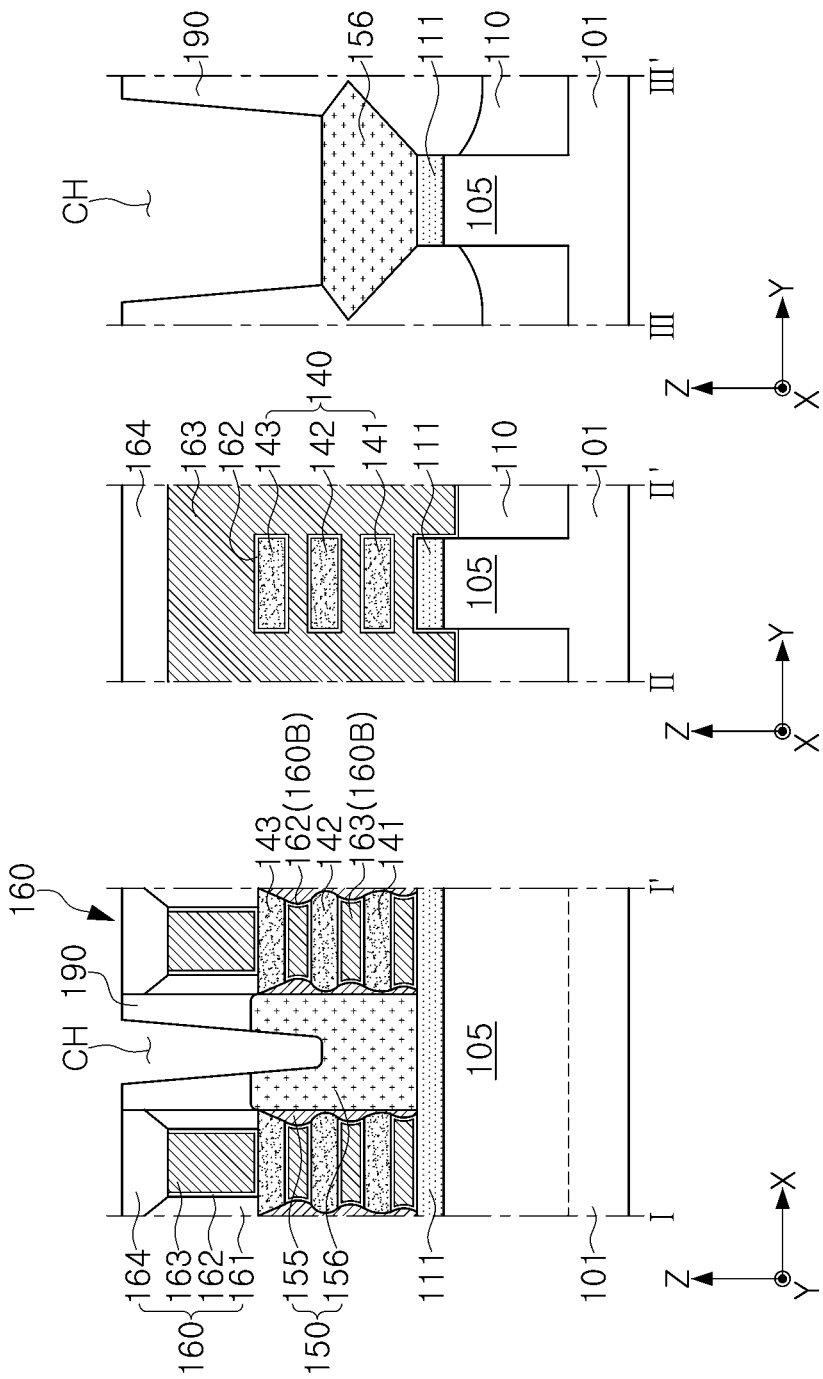
Figure 9J:
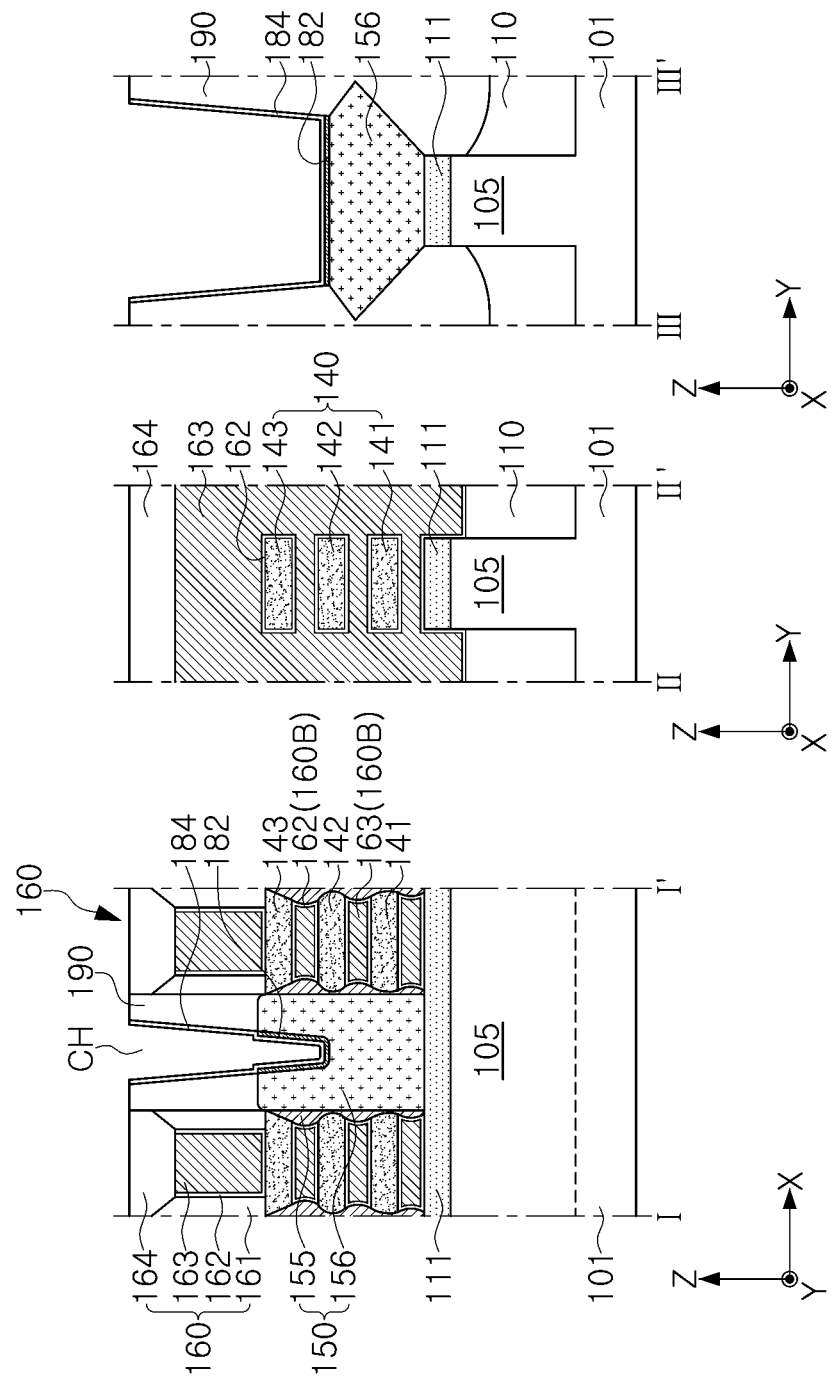

Referring to FIGS. 9I and 9J, the contact plug 180 may be formed.

First, as illustrated in FIG. 9I, contact holes CH exposing the source/drain regions 150 may be formed. Lower surfaces of the contact holes CH may be recessed into the source/drain regions 150.

Next, as illustrated in FIG. 9J, after a material of the barrier layer 184 is deposited, a process the same as a silicide process may be performed to form the metal-semiconductor compound layer 182 on bottom surfaces of the contact holes CH.

Next, referring to FIG. 2A, the plug conductive layer 186 may be formed by depositing a conductive material to fill the contact holes CH. Through this operation, the contact plugs 180 including the metal-semiconductor compound layer 182, the barrier layer 184, and the plug conductive layer 186 may be formed.

According to an example embodiment, the contact plug 180 may be formed to pass through at least a portion of the source/drain region 150. In this case, the metal-semiconductor compound layer 182 of the contact plug 180 may be in contact with portions of the epitaxial layers 156, and a lower end of the metal-semiconductor compound layer 182 may be positioned on a level lower than that of an upper end of the plurality of channel layers 141, 142, and 143. However, the shape and arrangement of the contact plug 180 are not limited thereto, and may be changed in various manners.

While example embodiments have been shown and described above, it will be apparent to those skilled in the art that modifications and variations could be made without departing from the scope of example embodiments as defined by the appended claims.

What is claimed is:

1. A semiconductor device comprising:
an active region extending on a substrate in a first direction;
a plurality of channel layers on the active region to be spaced apart from each other in a vertical direction, perpendicular to an upper surface of the substrate, the plurality of channel layers including silicon germanium (SiGe);
a gate structure intersecting the active region and the plurality of channel layers on the substrate to surround the plurality of channel layers, respectively, the gate structure extending in a second direction;
a source/drain region on the active region on at least one side of the gate structure, the source/drain region in contact with the plurality of channel layers; and
a substrate insulating layer disposed between the source/drain region and the substrate,
wherein the source/drain region includes:
a first layer in contact with a side surface of the gate structure, side surfaces of the plurality of channel layers, and an upper surface of the substrate insulating layer, and
a second layer having a composition different from that of the first layer and spaced apart from the substrate insulating layer by the first layer.

2. The semiconductor device of claim 1, wherein the source/drain region is spaced apart from the substrate by the substrate insulating layer.

3. The semiconductor device of claim 1, wherein:
the source/drain region further includes a third layer on the second layer,
the first layer includes first silicon germanium (SiGe) including germanium (Ge) having a first concentration,
the second layer includes second silicon germanium (SiGe) including germanium (Ge) having a second concentration higher than the first concentration, and
the third layer includes third silicon germanium (SiGe) including germanium (Ge) having a third concentration higher than the second concentration.

4. The semiconductor device of claim 1, wherein at least a portion of an outer surface of the first layer forms a surface, perpendicular to the upper surface of the substrate.

5. The semiconductor device of claim 1, wherein:
the source/drain region further includes a third layer disposed on the second layer, and
the third layer has a composition different from that of each of the first and second layers.

6. The semiconductor device of claim 5, wherein the third layer is disposed to completely fill a recessed region of the source/drain region.

7. The semiconductor device of claim 5, wherein the third layer is spaced apart from the substrate insulating layer by the first and second layers.

8. The semiconductor device of claim 1, wherein a germanium (Ge) concentration of each of the plurality of channel layers is about 15 at % to about 40 at %.

9. The semiconductor device of claim 1, further comprising:
an interlayer insulating layer covering the source/drain region; and
a contact plug passing through portions of the interlayer insulating layer and the source/drain region to be connected to the source/drain region.

10. The semiconductor device of claim 9, wherein the contact plug includes a metal-semiconductor compound layer.

11. A semiconductor device comprising:
an active region extending on a substrate in a first direction;
a plurality of channel layers on the active region to be spaced apart from each other in a vertical direction, perpendicular to an upper surface of the substrate, the plurality of channel layers including silicon germanium (SiGe);
a gate structure intersecting the active region and the plurality of channel layers on the substrate to surround the plurality of channel layers, respectively, the gate structure extending in a second direction;
a source/drain region on the active region on at least one side of the gate structure, the source/drain region in contact with the plurality of channel layers; and
a substrate insulating layer disposed between the source/drain region and the substrate,
wherein the source/drain region includes:
an epitaxial layer in contact with the substrate insulating layer, and
passivation layers in contact with at least portions of the gate structure and the plurality of channel layers, and
wherein the passivation layers are spaced apart from each other in the first direction by the epitaxial layer.

12. The semiconductor device of claim 11, wherein:
the passivation layers include impurities, and
a concentration of each of the impurities is greater than about 0 at % and less than or equal to about 10 at %.

13. The semiconductor device of claim 11, wherein the epitaxial layer is spaced apart from the gate structure and the plurality of channel layers by each of the passivation layers.

14. The semiconductor device of claim 11, wherein:
the gate structure includes an upper portion on the uppermost channel layer among the plurality of channel layers, and a lower portion below each of the plurality of channel layers, and
each of the passivation layers includes protrusions protruding toward the gate structure on a level the same as that of the lower portion of the gate structure.

15. The semiconductor device of claim 14, wherein a width of each of the protrusions in the first direction becomes narrower as a distance to the substrate insulating layer decreases.

16. The semiconductor device of claim 14, wherein a side surface of the epitaxial layer in contact with the passivation layers includes a portion protruding toward the passivation layers on a level the same as that of the lower portion of the gate structure.

17. A semiconductor device comprising:
an active region extending on a substrate in a first direction;
a plurality of channel layers on the active region to be spaced apart from each other in a vertical direction, perpendicular to an upper surface of the substrate, the plurality of channel layers including silicon germanium (SiGe);
a gate structure intersecting the active region and the plurality of channel layers on the substrate to surround the plurality of channel layers, respectively, the gate structure extending in a second direction;
a source/drain region on the active region on at least one side of the gate structure, the source/drain region in contact with the plurality of channel layers; and
a substrate insulating layer disposed between the source/drain region and the substrate,
wherein the source/drain region includes an epitaxial layer in contact with an upper surface of the substrate insulating layer,
wherein at least a portion of a side surface of the epitaxial layer forms a surface, perpendicular to the upper surface of the substrate,
wherein a lower surface of the epitaxial layer forms a flat surface, and
wherein a lower surface of a gate dielectric layer surrounding the lowermost gate electrode of the gate structure is in contact with the upper surface of the substrate insulating layer,
wherein the epitaxial layer is a first layer,
wherein the source/drain region further includes a second layer and a third layer isolated and spaced apart from each other by the first layer in the first direction,
wherein the second and third layers are the same layer as each other, and
wherein the first layer has a composition different from that of each of the second and third layers.

* * * * *